United States Patent
Lee et al.

(10) Patent No.: US 12,218,177 B2
(45) Date of Patent: Feb. 4, 2025

(54) DISPLAY DEVICE

(71) Applicant: Samsung Display Co., Ltd., Yongin-si (KR)

(72) Inventors: Won Ho Lee, Yongin-si (KR); Jong Hyuk Kang, Yongin-si (KR); Buem Joon Kim, Yongin-si (KR); Hyun Deok Im, Yongin-si (KR); Eun A Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 463 days.

(21) Appl. No.: 17/454,016

(22) Filed: Nov. 8, 2021

(65) Prior Publication Data

US 2022/0262846 A1   Aug. 18, 2022

(30) Foreign Application Priority Data

Feb. 16, 2021   (KR) .......................... 10-2021-0020737

(51) Int. Cl.
*H01L 27/15*   (2006.01)
*H01L 33/24*   (2010.01)
*H01L 33/38*   (2010.01)
*H01L 33/44*   (2010.01)

(52) U.S. Cl.
CPC ............ *H01L 27/156* (2013.01); *H01L 33/24* (2013.01); *H01L 33/38* (2013.01); *H01L 33/44* (2013.01)

(58) Field of Classification Search
CPC . H01L 27/156; H01L 27/124; H01L 27/1248; H01L 33/24; H01L 33/38; H01L 33/44; H01L 33/62; H01L 25/167; H01L 25/0753
See application file for complete search history.

(56) References Cited

U.S. PATENT DOCUMENTS

| | | | |
|---|---|---|---|
| 9,773,761 B2 | 9/2017 | Do | |
| 2019/0244567 A1* | 8/2019 | Cho | ...................... G09G 3/3233 |
| 2020/0043976 A1* | 2/2020 | Kim | ...................... H01L 33/504 |

FOREIGN PATENT DOCUMENTS

| KR | 10-1490758 B1 | 2/2015 |
|---|---|---|
| KR | 10-2020-0062458 A | 6/2020 |

* cited by examiner

*Primary Examiner* — Mohammad A Rahman
*Assistant Examiner* — Sandra Milena Rodriguez Villan
(74) *Attorney, Agent, or Firm* — Womble Bond Dickinson

(57) ABSTRACT

A display device in accordance with some embodiments may include a base layer, a first bank pattern and a second bank pattern on the base layer, and spaced apart from each other in a first direction, a first electrode overlapping the first bank pattern, a second electrode overlapping the second bank pattern, and a light emitting element aligned between the first electrode and the second electrode, wherein a distance between an end of the first electrode and an end of the first bank pattern differs from a distance between an end of the second electrode and an end of the second bank pattern in the first direction.

20 Claims, 13 Drawing Sheets

DISPLAY DEVICE

CROSS-REFERENCE TO RELATED APPLICATION

This application claims priority to, and the benefit of, Korean patent application number 10-2021-0020737 filed on Feb. 16, 2021, in the Korean Intellectual Property Office, the entire disclosure of which is incorporated herein in its entirety by reference.

BACKGROUND

1. Field

Various embodiments of the present disclosure relate to a display device.

2. Description of Related Art

With an increase in interest in an information display, and with an increase in demand to use portable information media, demand for display devices is markedly increased, and commercialization thereof is in progress.

SUMMARY

Various embodiments of the present disclosure are directed to a display device capable of mitigating an eccentricity defect of a light emitting element when the light emitting element is aligned.

A display device in accordance with some embodiments may include a base layer, a first bank pattern and a second bank pattern on the base layer, and spaced apart from each other in a first direction, a first electrode overlapping the first bank pattern, a second electrode overlapping the second bank pattern, and a light emitting element aligned between the first electrode and the second electrode, wherein a distance between an end of the first electrode and an end of the first bank pattern differs from a distance between an end of the second electrode and an end of the second bank pattern in the first direction.

The distance between the end of the first electrode and the end of the first bank pattern may be greater than the distance between the end of the second electrode and the end of the second bank pattern in the first direction.

The distance between the end of the first electrode and the end of the first bank pattern may be less than the distance between the end of the second electrode and the end of the second bank pattern in the first direction.

In a plan view, a width of the first bank pattern may be substantially identical to a width of the second bank pattern in the first direction.

In the plan view, a width of the first electrode may differ from a width of the second electrode in the first direction.

The width of the first electrode may be greater than the width of the second electrode in the first direction.

The width of the first electrode may be less than the width of the second electrode in the first direction.

A distance between the end of the first electrode and the end of the first bank pattern may be substantially identical to a distance between a second end of the first electrode and a second end of the first bank pattern.

A distance between the end of the first electrode and the end of the first bank pattern may differ from a distance between a second end of the first electrode and a second end of the first bank pattern.

The light emitting element may be aligned between the first electrode and the second electrode such that a longitudinal direction of the light emitting element is substantially parallel with the first direction, wherein a first end of the light emitting element is electrically coupled with the first electrode, and a second end of the light emitting element is electrically coupled with the second electrode.

The distance between the end of the first electrode and the end of the first bank pattern may be about 3 μm or more in the first direction, wherein the distance between the end of the second electrode and the end of the second bank pattern is less than about 3 μm.

A display device in accordance with some embodiments may include a base layer, a bank pattern including a first bank pattern and a second bank pattern on the base layer and spaced apart from each other, a first electrode on the first bank pattern, at least partially overlapping with the first bank pattern, and including an extension that does not overlap with the first bank pattern, a second electrode on the second bank pattern, at least partially overlapping with the second bank pattern, and including an extension that does not overlap with the second bank pattern, and a light emitting element aligned between the first electrode and the second electrode, wherein a length of the extension of the first electrode differs from a length of the extension of the second electrode.

The length of the extension of the first electrode may be from an end of the first bank pattern to an end of the first electrode, wherein the length of the extension of the second electrode is from an end of the second bank pattern to an end of the second electrode.

The length of the extension of the first electrode may be greater than the length of the extension of the second electrode.

The length of the extension of the first electrode may be about 3 μm or more, wherein the length of the extension of the second electrode is less than about 3 μm.

The length of the extension of the first electrode may be less than the length of the extension of the second electrode.

The length of the extension of the first electrode may be less than about 3 μm, wherein the length of the extension of the second electrode is about 3 μm or more.

The display device may further include a first contact electrode at least partially overlapping a first end of the light emitting element, and a second contact electrode at least partially overlapping with a second end of the light emitting element.

The first contact electrode may be electrically coupled with the first electrode, and is electrically coupled with the first end of the light emitting element.

The second contact electrode may be electrically coupled with the second electrode, and is electrically coupled with the second end of the light emitting element.

DETAILED DESCRIPTION

Figure 1:
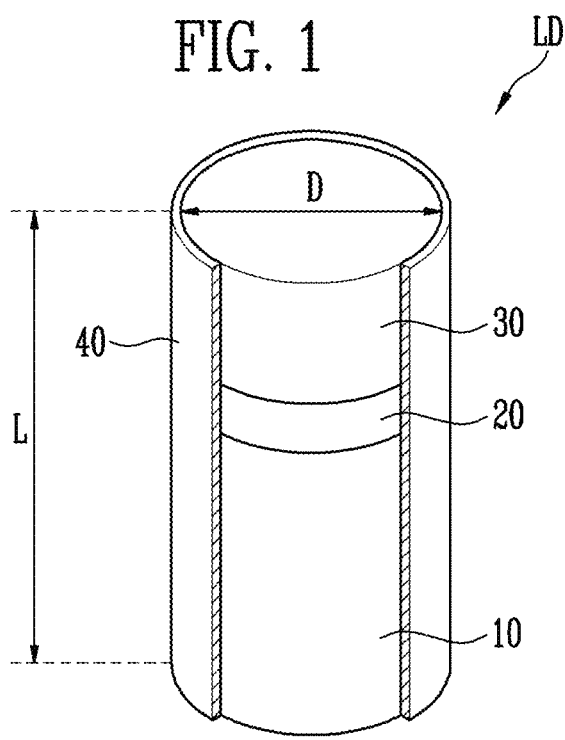
FIG. 1 is a perspective diagram illustrating a light emitting element in accordance with some embodiments.

Aspects of some embodiments of the present disclosure may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, when a first part such as a layer, a film, a region, or a plate is under a second part, the first part may be not only directly under the second part but a third part may intervene between them.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions. Hereinafter, a horizontal direction will be designated as a first direction DR1, a vertical direction perpendicular to the horizontal direction will be designated as a second direction DR2, and a direction perpendicular to the first direction DR1 and the second direction DR2 will be designated as a third direction DR3. However, depending on a reference direction, the first direction DR1 may indicate the vertical direction, and the second direction DR2 may indicate the horizontal direction. Furthermore, the first direction DR1 and the second direction DR2 may refer to directions on a plan view, and the third direction DR3 may refer to a direction on a sectional view.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware, to process data or digital signals. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Circuit hardware may include, for example, application specific integrated circuits (ASICs), general purpose or special purpose central processing units (CPUs) that is configured to execute instructions stored in a non-transitory storage medium, digital signal processors (DSPs), graphics processing units (GPUs), and programmable logic devices such as field programmable gate arrays (FPGAs).

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a display device in accordance with some embodiments of the present disclosure will be described with reference to the attached drawings.

First, a light emitting element included in a display device in accordance with some embodiments of the present disclosure will be described with reference to FIG. 1.

FIG. 1 is a perspective diagram illustrating a light emitting element in accordance with some embodiments.

Referring to FIG. 1, a light emitting element LD in a display device in accordance with some embodiments includes a first semiconductor layer 10, a second semiconductor layer 30, and an active layer 20 located between the first semiconductor layer 10 and the second semiconductor layer 30. For example, the light emitting element LD may be configured of a stacked body formed by successively stacking the first semiconductor layer 10, the active layer 20, and the second semiconductor layer 30 in a longitudinal direction (L).

The light emitting element LD may be provided in the form of a rod (e.g., a cylinder) extending in one direction. If the direction in which the light emitting element LD extends is defined as a longitudinal direction (L), the light emitting element LD may have a first end and a second end with respect to the longitudinal direction (L). Although FIG. 1 illustrates a rod-type light emitting element, the type and/or shape of the light emitting element in accordance with some embodiments is not limited thereto.

The light emitting element LD may be a rod-type light emitting diode manufactured in the form of a rod. In this specification, the term "rod-type" embraces a rod-like shape and a bar-like shape such as a cylindrical shape and a prismatic shape extending in a longitudinal direction (e.g., to have an aspect ratio greater than 1), and the cross-sectional shape thereof is not limited to a particular shape. For example, the length L of the light emitting element LD may be greater than a diameter D thereof (or greater than a width of the cross-section thereof). However, the present disclosure is not limited thereto. In some embodiments, the light emitting element LD may have a rod-like shape, or a bar-like shape, which is short with respect to the longitudinal direction L (e.g., to have an aspect ratio less than 1). In some embodiments, the light emitting element LD may have a rod-like shape, or a bar-like shape, in which the length L thereof and the diameter D thereof are the same as each other.

The light emitting element LD may have a small size ranging from the nanometer scale to the micrometer scale. Each light emitting element LD may have a diameter D and/or a length L ranging from the nanometer scale to the micrometer scale. For example, the length L of the light emitting element LD may range from approximately 100 nm to approximately 10 μm, and the diameter D of the light emitting element LD may range from approximately 2 μm to approximately 6 μm. The aspect ratio of the light emitting element LD may range from approximately 1.2 to approximately 100. However, in the present disclosure, the size of the light emitting element LD is not limited thereto. For example, the size of the light emitting element LD may be changed in various ways depending on design conditions of various devices (e.g., a display device), which employ, as a light source, a light emitting device using a light emitting element LD.

The first semiconductor layer 10 may include at least one n-type semiconductor layer. For instance, the first semiconductor layer 10 may include an n-type semiconductor layer that includes any one semiconductor material of InAlGaN, GaN, AlGaN, InGaN, AlN, and InN and that is doped with a first conductive dopant such as Si, Ge, or Sn. However, the constituent material of the first semiconductor layer 10 is not limited thereto, and the first semiconductor layer 10 may be formed of various other materials.

The active layer 20 may be located on the first semiconductor layer 10 and may have a single or multiple quantum well structure. In some embodiments, a cladding layer doped with a conductive dopant may be formed over and/or under the active layer 20. For example, the cladding layer may be formed of an AlGaN layer or an InAlGaN layer. In some embodiments, a material such as AlGaN or InAlGaN may be used to form the active layer 20, and various other materials may be used to form the active layer 20.

If a voltage equal to or greater than a threshold voltage is applied between the opposite ends of the light emitting element LD, the light emitting element LD may emit light by coupling of electron-hole pairs in the active layer 20. Because light emission of the light emitting element LD can be controlled based on the foregoing principle, the light emitting element LD may be used as a light source of various light emitting devices, and also as a pixel of the display device.

The second semiconductor layer 30 may be located on the active layer 20, and may include a semiconductor layer having a type that is different from that of the first semiconductor layer 10. For example, the second semiconductor layer 30 may include at least one p-type semiconductor layer. For instance, the second semiconductor layer 30 may include a p-type semiconductor layer that includes any one semiconductor material of InAlGaN, GaN, AlGaN, InGaN, AlN, and InN, and that is doped with a second conductive dopant such as Mg, Zn, Ca, Sr, or Ba. However, the material for forming the second semiconductor layer 30 is not limited thereto, and the second semiconductor layer 30 may be formed of various other materials.

Although in the foregoing embodiments there has been described an example in which the first semiconductor layer 10 and the second semiconductor layer 30 each is formed of a single layer, the present disclosure is not limited thereto. In some embodiments, depending on the material of the active layer 20, the first semiconductor layer 10 and/or the second semiconductor layer 30 may further include at least one or more layers, for example, a clad layer and/or a tensile strain barrier reducing (TSBR) layer. The TSBR layer may be a strain relief layer of which a lattice structure is located between other semiconductor layers so that the strain relief layer functions as a buffer layer to reduce a difference in lattice constant. Although the TSBR layer may be formed of a p-type semiconductor layer such as p-GaInP, p-AlInP, or p-AlGaInP, the present disclosure is not limited thereto.

In some embodiments, the light emitting element LD may further include an insulating film 40 provided on a surface of the light emitting element LD. The insulating film 40 may be formed on the surface of the light emitting element LD to enclose an outer circumferential surface of the active layer 20, and also to enclose one or more areas (e.g., predetermined areas) of the first semiconductor layer 10 and the second semiconductor layer 30. In some embodiments, the insulating film 40 may allow the opposite ends of the light emitting element LD that have different polarities to be exposed to the outside. For example, the insulating film 40 may expose one end of each of the first semiconductor layer 10 and the second semiconductor layer 30 that are located on opposite respective ends of the light emitting element LD with respect to the longitudinal direction (L). For example, the insulating film 40 may expose two end surfaces of the cylinder (e.g., upper and lower surfaces of the light emitting element LD) rather than covering them.

If the insulating film 40 is provided on the surface of the light emitting element LD, for example, on the surface of the active layer 20, a short-circuit of the active layer 20 with at least one electrode (e.g., at least one contact electrode of contact electrodes coupled to the opposite ends of the light emitting element LD) may be reduced or prevented. Consequently, the electrical stability of the light emitting element LD may be secured.

Because the light emitting element LD includes the insulating film 40 on the surface thereof, occurrence of a defect on the surface of the light emitting element LD may be reduced or minimized, whereby the lifetime and efficiency of the light emitting element LD may be improved. In addition, if each light emitting element LD includes the insulating film 40, short-circuiting of a plurality of light emitting elements LD, even when the light emitting elements LD are located adjacent to each other, may be reduced or prevented.

In some embodiments, the light emitting element LD may be fabricated through a surface treatment process. For example, each light emitting element LD may be surface-treated so that, when a plurality of light emitting elements LD are mixed with a fluidic solution (or solvent) and then supplied to each emission area (e.g., an emission area of each pixel), the light emitting elements LD can be evenly dispersed rather than unevenly aggregating in the solution.

In some embodiments, the light emitting element LD may further include additional other components as well as the first semiconductor layer 10, the active layer 20, the second semiconductor layer 30, and the insulating film 40. For example, the light emitting element LD may further include at least one fluorescent layer, at least one active layer, at least one semiconductor layer and/or at least one electrode located on one end side of the first semiconductor layer 10, the active layer 20, and the second semiconductor layer 30.

The light emitting element LD described above may be used in various devices, including a display device which uses a light source. For instance, at least one light emitting element LD (e.g., a plurality of light emitting elements LD each having a size ranging from the nanometer scale to the micrometer scale) may be located in each pixel area of the display device to form a light source (or, a light source unit) of the corresponding pixel using the light emitting elements LD. Furthermore, the field of application of the light emitting element LD according to the present disclosure is not limited to a display device. For example, the light emitting element LD may also be used in other types of devices, such as a lighting device, which uses a light source.

Hereinafter, a display device including pixels will be described with reference to FIG. 2.

Figure 2:
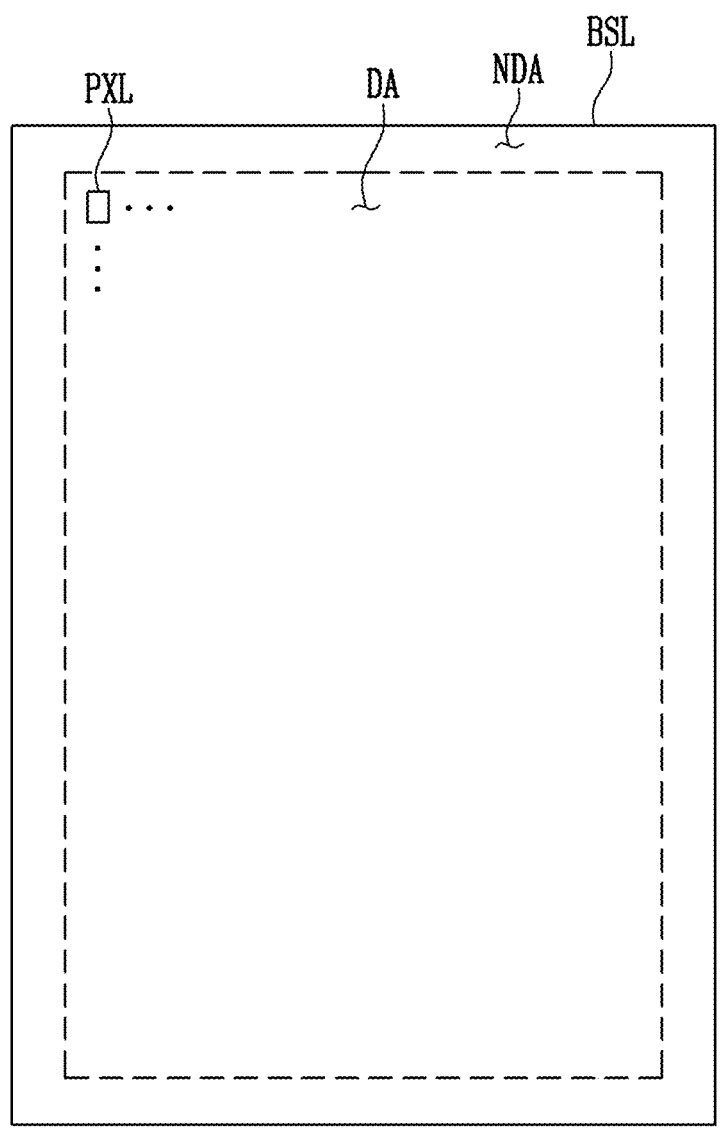
FIG. 2 is a plan view illustrating an example of a display device in accordance with some embodiments.

FIG. 2 is a plan view illustrating an example of a display device in accordance with some embodiments.

FIG. 2 illustrates an example of a display device capable of using the light emitting element LD described with reference to FIG. 1 as a light source, and the pixels PXL of the display device may include at least one light emitting element LD.

Referring to FIG. 2, the display device in accordance with some embodiments may include a base layer BSL, and a plurality of pixels PXL located on the base layer BSL.

In detail, the display device and the base layer BSL for forming the display device may include a display area DA configured to display an image, and a non-display area NDA formed in an area (e.g., a predetermined area) other than the display area DA. The non-display area NDA may be a bezel area which encloses the display area DA.

The base layer BSL may form a base of the display device. In some embodiments, the base layer BSL may be a rigid or flexible substrate or film, and the material or properties thereof are not particularly limited. For example, the base layer BSL may be a rigid substrate made of glass or reinforced glass, a flexible substrate (or a thin film) formed of plastic or metal, or at least one insulating layer, and the material and/or properties thereof are not particularly limited. Furthermore, the base layer BSL may be transparent, but the present disclosure is not limited thereto. For instance, the base layer BSL may be a transparent, translucent, opaque, or reflective base.

The display area DA may be located on one surface of the display device. For example, the display area DA may be located not only on a frontal surface of the display device, but also additionally on a sidewall or a rear surface of the display device.

The non-display area NDA may be located around the display area DA to enclose the display area DA, and may selectively include lines, pads, a driving circuit, etc. coupled to the pixels PXL of the display area DA.

For the sake of explanation, FIG. 2 illustrates only one pixel PXL, but a plurality of pixels PXL may be dispersedly provided in the display area DA. In some embodiments, the pixels PXL may be arranged in the display area DA in a matrix, stripe or PenTile/PENTILE® arrangement manner (e.g., a PENTILE® matrix structure or an RGBG structure (e.g., a PENTILE® structure)). PENTILE® is a registered trademark of Samsung Display Co., Ltd., Republic of Korea.

Hereinafter, connection relationship of each pixel of the display device in accordance with some embodiments will be described with reference to FIGS. 3 and 4.

Figure 3:
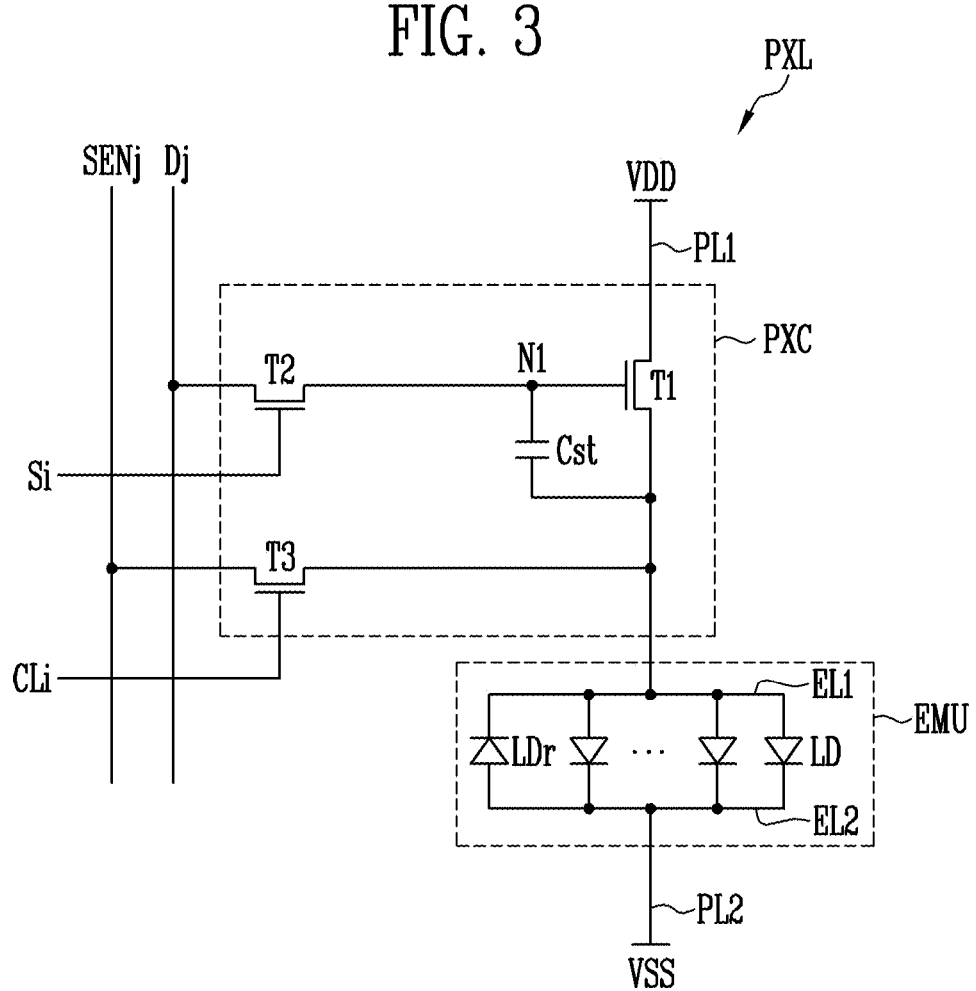
FIGS. 3 and 4 are circuit diagrams illustrating a pixel of a display device in accordance with some embodiments.
Figure 4:
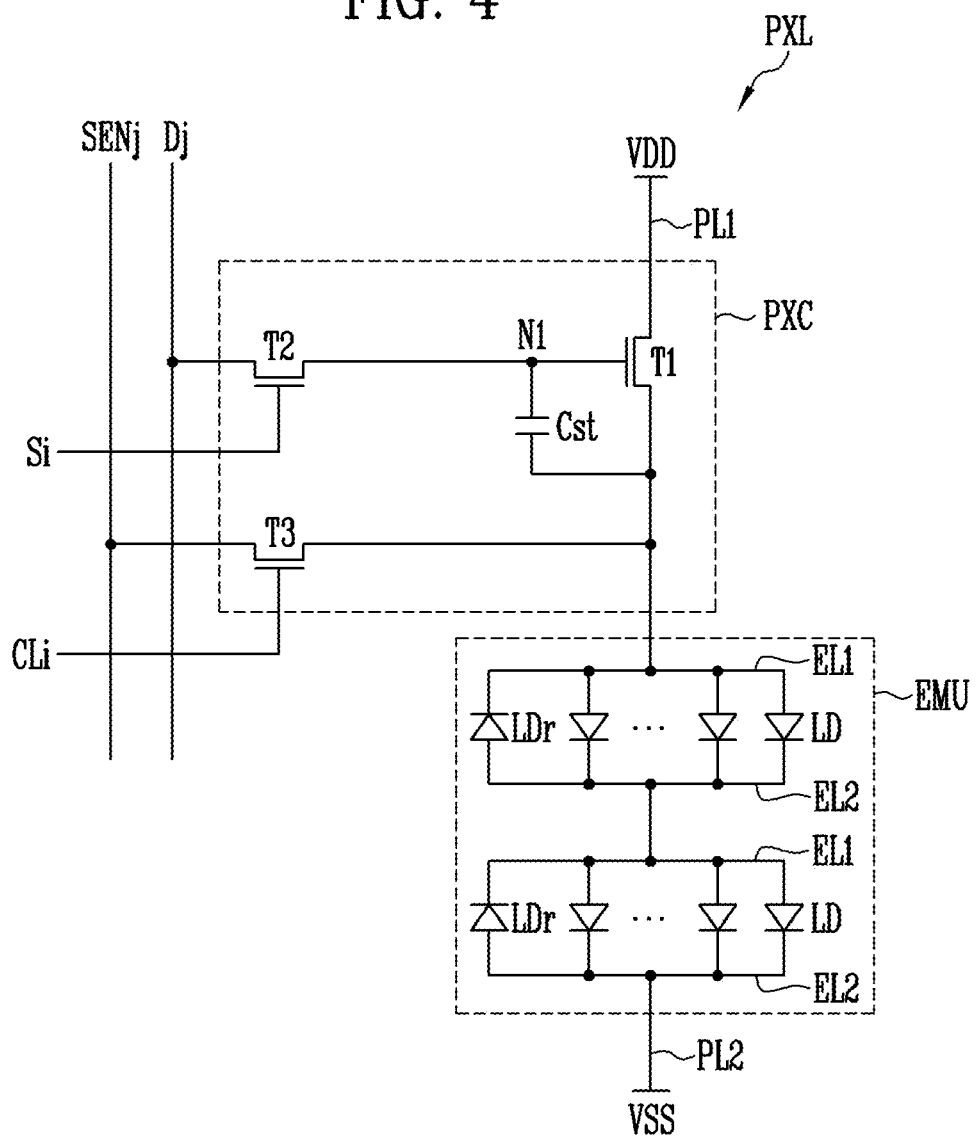

FIGS. 3 and 4 are circuit diagrams illustrating a pixel of the display device in accordance with some embodiments.

Referring to FIGS. 3 and 4, each pixel PXL may include an emission unit EMU configured to generate light having a luminance corresponding to a data signal. Furthermore, the pixel PXL may selectively further include a pixel circuit PXC configured to drive the emission unit EMU.

The emission unit EMU may include light emitting elements LD coupled between a first power line PL1 to which the voltage of a first driving power supply VDD is applied, and a second power line PL2 to which the voltage of a second driving power supply VSS is applied.

In detail, the emission unit EMU may include a first electrode EL1 coupled to the first driving power supply VDD via the pixel circuit PXC and the first power line PL1, a second electrode EL2 coupled to the second driving power supply VSS through the second power line PL2, and light emitting elements LD coupled in parallel to each other in the same direction between the first electrode EL1 and the second electrode EL2. In some embodiments, the first electrode EL1 may be an anode, and the second electrode EL2 may be a cathode.

Each of the light emitting elements LD included in the emission unit EMU may include one end (or a first end) coupled to the first driving power supply VDD through the first electrode EL1, and the other end (or a second end) coupled to the second driving power supply VSS through the second electrode EL2.

The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first driving power supply VDD and the second driving power supply VSS may be set to a value equal to or greater than a threshold voltage of the light emitting elements LD during an emission period of the pixel PXL.

As described above, the light emitting elements LD that are coupled in parallel to each other in the same direction (e.g., in a forward direction) between the first electrode EL1 and the second electrode EL2, to which voltages having different potentials are respectively supplied, may form respective valid light sources. The valid light sources may be collected to form the emission unit EMU of the pixel PXL.

In some embodiments, the emission unit EMU may further include at least one invalid light source (e.g., a reverse light emitting element LDr), as well as the light emitting elements LD that form the respective valid light sources. The reverse light emitting element LDr, along with the light emitting elements LD that form the valid light sources, may be coupled in parallel to each other between the first electrode EL1 and the second electrode EL2. Here, the reverse light emitting element LDr may be coupled between the first electrode EL1 and the second electrode EL2 in a direction that is opposite to that of the light emitting elements LD. Even when a driving voltage (e.g., a predetermined driving voltage, such as a forward driving voltage, for example) is applied between the first electrode EL1 and the second electrode EL2, the reverse light emitting element LDr remains disabled. Hence, current does not flow through the reverse light emitting element LDr to a substantial degree.

The light emitting elements LD of the emission unit EMU may emit light having a luminance corresponding to driving current supplied thereto through the pixel circuit PXC. For example, during each frame period, the pixel circuit PXC may supply driving current corresponding to a gray scale value of one frame data to the emission unit EMU. The driving current supplied to the emission unit EMU may be divided into parts that flow into the respective light emitting elements LD. Hence, each of the light emitting elements LD may emit light having a luminance corresponding to current applied thereto, so that the emission unit EMU may emit light having a luminance corresponding to the driving current.

Although FIG. 3 illustrates some embodiments in which all of the light emitting elements LD that form the emission unit EMU are coupled in parallel to each other, the present disclosure is not limited thereto.

Referring to FIG. 4, the emission unit EMU may include a serial stage including light emitting elements LD coupled in parallel to each other. For example, the emission unit EMU may include two serial stages. In some embodiments, the light emitting elements LD may be coupled by n serial stages (n being a natural number). In other words, the emission unit LSU may be formed of a serial/parallel combination structure.

The pixel circuit PXC may be coupled to a scan line Si and a data line Dj of one pixel PXL. For example, in the case where the pixel PXL is located on an i-th row (i is a natural number) and a j-th column (j is a natural number) of the display area DA, the pixel circuit PXC of the pixel PXL may be coupled to an i-th scan line Si and a j-th data line Dj of the display area DA. Furthermore, the pixel circuit PXC may be coupled to an i-th control line CLi and a j-th sensing line SENj of the display area DA.

The pixel circuit PXC may include a first transistor T1, a second transistor T2, a third transistor T3, and a storage capacitor Cst.

A first terminal of the first transistor T1 (or the driving transistor) is coupled to the first driving power supply VDD, and a second terminal thereof is electrically coupled to the first electrode EL1. A gate electrode of the first transistor T1 is coupled to a first node N1. Hence, the first transistor T1 may control the amount of driving current to be supplied to the light emitting elements LD in response to the voltage of the first node N1.

A first terminal of the second transistor T2 (or the switching transistor) is coupled to a data line Dj, and a second terminal thereof is coupled to a first node N1. A gate electrode of the second transistor T2 is coupled to the scan line Si. The second transistor T2 may be turned on when a scan signal (e.g., of a high level) having a turn-on voltage is supplied from the scan line Si, so that the data line Dj and the first node N1 may be electrically coupled to each other. Here, if a data signal of one frame is supplied to the data line Dj, the data signal may be transmitted to the first node N1. The data signal transmitted to the first node N1 may be charged to the storage capacitor Cst.

The third transistor T3 is coupled between the first transistor T1 and the sensing line SENj. In detail, a first terminal of the third transistor T3 is coupled to the second terminal of the first transistor T1, and a second terminal of the third transistor T3 is coupled to the sensing line SENj. A gate electrode of the third transistor T3 is coupled to the control line CLi. The third transistor T3 may be turned on by a control signal (e.g., a high level) that has a gate-on voltage and is supplied to the i-th control cline CLi during a sensing period (e.g., a predetermined sensing period), so that the sensing line SENj and the first transistor T1 can be electrically coupled to each other. The sensing period may be a period in which characteristic information (e.g., a threshold voltage, etc. of the first transistor T1) of one or more of the pixels PXL located in the display area DA is extracted.

One electrode of the storage capacitor Cst is coupled to the first node N1, and the other electrode thereof is coupled to the second electrode of the first transistor T1. The storage capacitor Cst may be charged with a voltage corresponding to a difference between a voltage corresponding to a data signal supplied to the first node N1 and a voltage of the second terminal of the first transistor T1, and may maintain the charged voltage until a data signal of a subsequent frame is supplied.

Although FIGS. 3 and 4 illustrate some embodiments where all of the first to third transistors T1 to T3 are N-type transistors, the present disclosure is not limited thereto. In some embodiments, at least one of the first to third transistors T1 to T3 may be changed to a P-type transistor.

Furthermore, although FIGS. 3 and 4 illustrate some embodiments where the emission unit EMU is coupled between the pixel circuit PXC and the second driving power supply VSS, the emission unit EMU may be coupled between the first driving power supply VDD and the pixel circuit PXC.

Hereinafter, a structure of the display device in accordance with some embodiments will be described in detail with reference to FIGS. 5 to 7.

Figure 5:
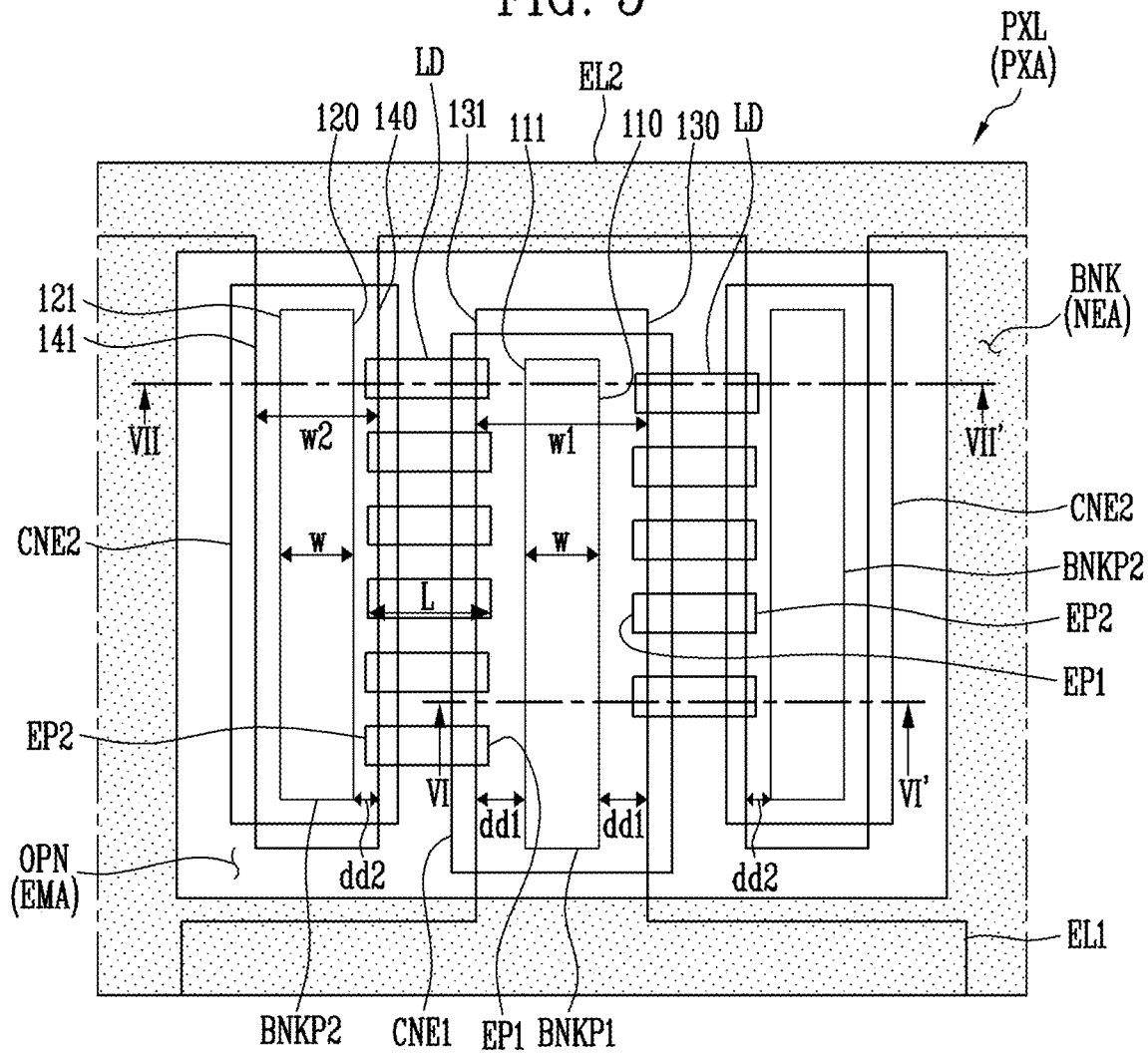
FIG. 5 is a plan view showing an area of a display area of the display device in accordance with some embodiments.
Figure 6:
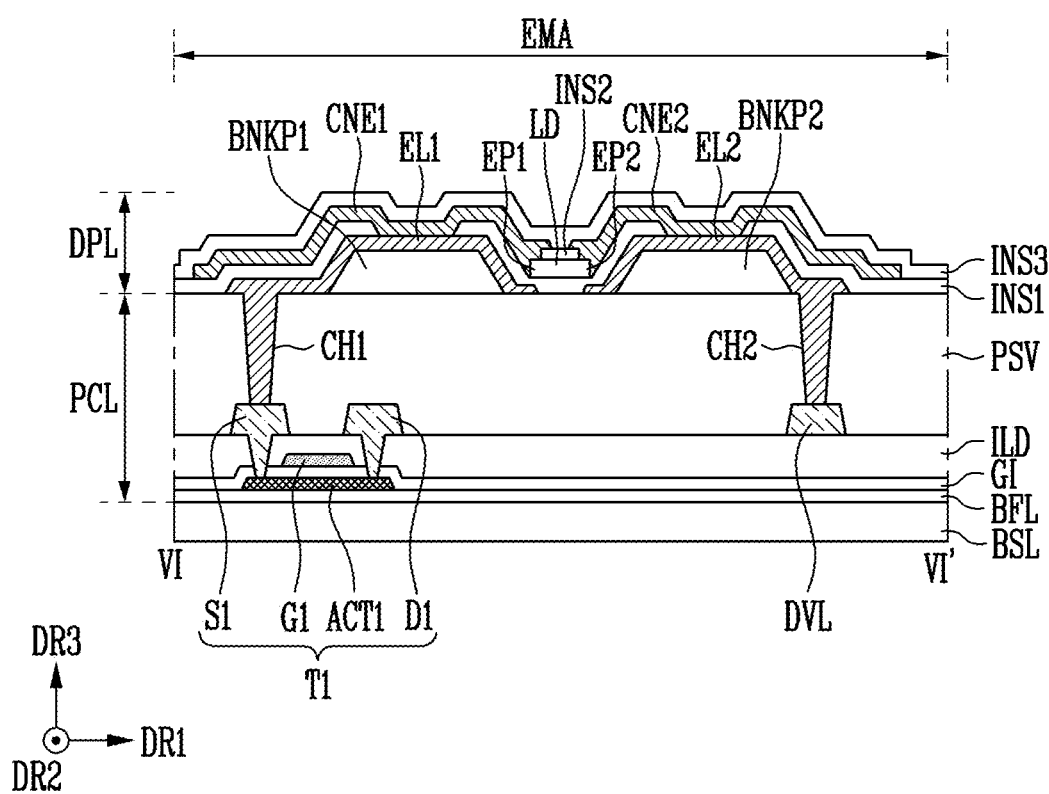
FIG. 6 is a sectional view taken along the line VI-VI' of FIG. 5.
Figure 7:
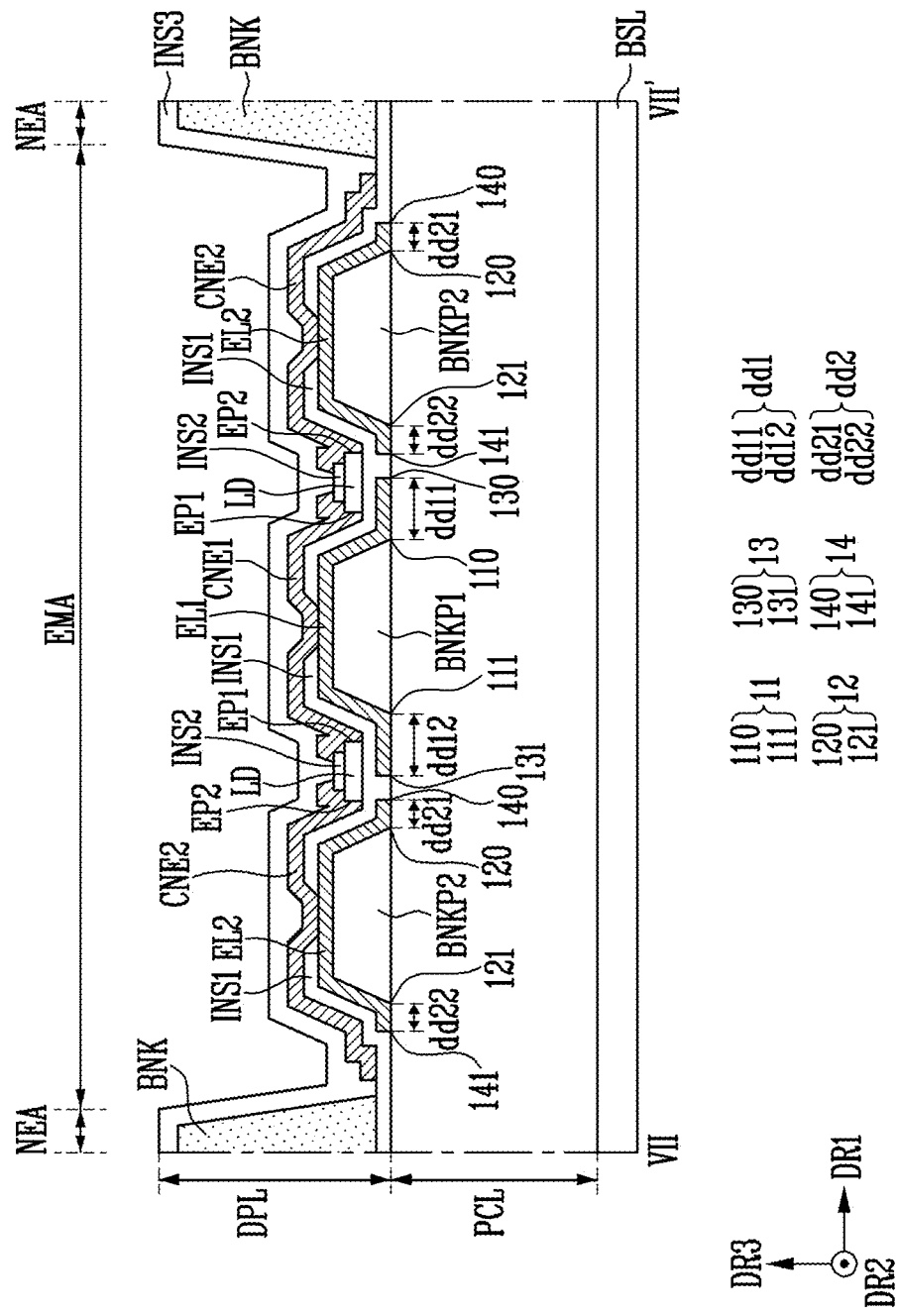
FIG. 7 is a sectional view taken along the line VII-VII' of FIG. 5.

FIG. 5 is a plan view showing an area of the display area of the display device in accordance with some embodiments, FIG. 6 is a sectional view taken along the line VI-VI' of FIG. 5, and FIG. 7 is a sectional view taken along the line VII-VII' of FIG. 5.

For the sake of explanation, in FIG. 5, some of the transistors that are electrically coupled to the light emitting elements LD and some of the signal lines that are electrically coupled to the transistors will be omitted.

Referring to FIG. 5, each pixel PXL may be formed in the pixel area PXA that is provided in the display area DA of the base layer BSL shown in FIG. 2. The pixel area PXA may include an emission area EMA, and a non-emission area NEA formed in an area (e.g., a predetermined area) that does not include than the emission area EMA. The non-emission area NEA may be an area that encloses or encircles the emission area EMA.

Each pixel PXL may include a bank BNK, a bank pattern BNKP, a first electrode EL1, a second electrode EL2, a first contact electrode CNE1, a second contact electrode CNE2, and a light emitting element LD.

The bank BNK may be located in the non-emission area NEA of the pixel area PXA. With regard to the pixel PXL illustrated in the drawing, and with regard to the pixels PXL adjacent thereto, the bank BNK may be a structure for defining (or partitioning) the pixel areas PXA and/or emission areas EMA of the respective pixels PXL. In some embodiments, during a process of supplying light emitting elements to each pixel PXL, the bank BNK may be a pixel defining layer or a dam structure for defining an area to which the light emitting elements LD are to be supplied. For example, because the emission area EMA of each pixel PXL is defined by the bank BNK, a mixed solution (e.g., ink) including a target amount and/or type of light emitting elements LD may be supplied (or input) to the emission area EMA.

The bank BNK may include at least one opening (e.g., opening OPN) that exposes components located under the bank BNK (e.g., in the pixel area PXA). The opening OPN of the bank BNK may correspond to the emission area EMA of the pixel PXL. In the opening OPN, the bank pattern BNKP, the light emitting elements LD, the first contact electrode CNE1, and the second contact electrode CNE2 may be located, and a portion of the first electrode EL1 and a portion of the second electrode EL2 may also be located.

The bank pattern BNKP is located in the emission area EMA. The bank pattern BNKP may be a support that supports the first electrode EL1 and the second electrode EL2 to change surface profiles (or shapes) of the first electrode EL1 and the second electrode EL2, which will be described below, so that light emitted from the light emitting elements LD can be guided in an image display direction (e.g., in the third direction DR3) of the display device. In a plan view, the bank pattern BNKP may have a bar shape extending in the second direction DR2, but the present disclosure is not limited thereto. In some embodiments, the bank pattern BNKP may be changed in various ways within a range in which the first electrode EL1 and the second electrode EL2 can be stably supported.

The bank pattern BNKP may include a first bank pattern BNKP1 and a second bank pattern BNKP2. The first bank pattern BNKP1 and the second bank pattern BNKP2 may be located at positions spaced apart from each other in the first direction DR1. The first bank pattern BNKP1 may be a support for supporting the first electrode EL1 and may at least partially overlap with the first electrode EL1. The second bank pattern BNKP2 may be a support for supporting the second electrode EL2 and may at least partially overlap with the second electrode EL2.

In a plan view, a width w of the first bank pattern BNKP1 and a width w of the second bank pattern BNKP2 may be substantially identical to each other. However, the present disclosure is not limited thereto, and in some embodiments, the width w of the first bank pattern BNKP1 and the width w of the second bank pattern BNKP2 may be different from each other.

The first electrode EL1 may partially extend in both the first direction DR1 and the second direction DR2. The first electrode EL1 that extends in the first direction DR1 may be separated from another first electrode EL1 that is included in a pixel PXL adjacent to the first electrode EL1 in the direction DR1, and that is located in another opening of the bank BNK.

The second electrode EL2 may partially extend in both the first direction DR1 and the second direction DR2. The second electrode EL2 may be spaced apart from the first electrode EL1 in the first direction DR1 and/or the second direction DR2. The second electrode EL2 may extend from another second electrode EL2 (e.g., another portion of the second electrode EL2) included in another PXL that is adjacent in the first direction DR1.

The first electrode EL1 and the second electrode EL2 may be used as alignment electrodes in such a way that alignment voltages are applied thereto after a mixed solution (e.g., ink) including light emitting elements LD is input to the emission area EMA. The first electrode EL1 may be a first alignment electrode, and the second electrode EL2 may be a second alignment electrode. Here, the light emitting elements LD may be aligned in a desired direction and/or at respective desired positions by an electric field formed between the first alignment electrode and the second alignment electrode. Furthermore, the first electrode EL1 and the second electrode EL2 may function as driving electrodes for driving the light emitting elements LD after the light emitting elements LD have been aligned.

The first electrode EL1 may be an anode of the emission unit EMU described with reference to FIGS. 3 and 4. Hence, the first electrode EL1 may be physically and/or electrically coupled with the first transistor T1 described with reference to FIGS. 3 and 4.

The second electrode EL2 may be a cathode of the emission unit EMU described with reference to FIGS. 3 and 4. Hence, the second electrode EL2 may be physically and/or electrically coupled with the second power line PL2 (or the second driving power supply VSS) described with reference to FIGS. 3 and 4.

In a plan view, a width w1 of the first electrode EL1 may be different from a width w2 of the second electrode EL2 based on the first direction DR1. In some embodiments, the width w1 of the first electrode EL1 may be greater than the width w2 of the second electrode EL2. In some embodiments, the width w1 of the first electrode EL1 may be less than the width w2 of the second electrode EL2.

In a plan view, because the width w of the first bank pattern BNKP1 and the width w of the second bank pattern BNKP2 are substantially identical to each other based on the first direction DR1, a distance dd1 between an edge/end 13 of the first electrode EL1 and an edge/end 11 (or a side surface) of the first bank pattern BNKP1, with respect to the first direction DR1, may be greater than a distance dd2 between an edge/end 14 of the second electrode EL2 and an edge/end 12 (or a side surface) of the second bank pattern BNKP2. However, the present disclosure is not so limited. For example, in some embodiments, in the case where the width w1 of the first electrode EL1 is less than the width w2 of the second electrode EL2, the distance dd1 between the end 13 of the first electrode EL1 and the end 11 of the first bank pattern BNKP1 based on the first direction DR1 may be less than the distance dd2 between the end 14 of the second electrode EL2 and the end 12 of the second bank pattern BNKP2.

In other words, the distance dd1 between the end 11 of the first bank pattern BNKP1 and the end 13 of the first electrode EL1 may be different from the distance dd2 between the end 12 of the second bank pattern BNKP2 and the end 14 of the second electrode EL2. For example, the distance dd1 between the end 11 of the first bank pattern BNKP1 and the end 13 of the first electrode EL1 may be about 3 μm or more. The distance dd2 between the end 12 of the second bank pattern BNKP2 and the end 14 of the second electrode EL2 may be less than about 3 μm. However, the present disclosure is not limited thereto. In some embodiments, the distance dd1 between the end 11 of the first bank pattern BNKP1 and the end 13 of the first electrode EL1 may be less than about 3 μm, and the distance dd2 between the end 12 of the second bank pattern BNKP2 and the end 14 of the second electrode EL2 may be about 3 μm or more.

In some embodiments, the distance dd1 between the end 11 of the first bank pattern BNKP1 and the end 13 of the first electrode EL1, and the distance dd2 between the end 12 of the second bank pattern BNKP2 and the end 14 of the second electrode EL2, may be formed to be different from each other, so that when the light emitting elements LD are aligned, the intensity of electric force formed on the end 13 of the first electrode EL1 may be different from the intensity of electric force formed on the end 14 of the second electrode EL2. For example, the size of an electric field formed on one side at which the distance dd1 or dd2 between the end 11 or 12 of the first or second bank pattern BNKP1 or BNKP2 and the end 13 or 14 of the first or second electrode EL1 or EL2 is small may be greater than that of the other side.

If the intensity of electric force formed on the end 13 of the first electrode EL1 differs from the intensity of electric force formed on the end 14 of the second electrode EL2, the light emitting elements LD may be eccentric with respect to a direction (e.g., a predetermined direction). For example, the light emitting elements may be aligned at positions displaced from the center. Hence, the light emitting elements LD may be aligned in the corresponding direction and/or at positions (e.g., predetermined positions) between the first electrode EL1 and the second electrode EL2.

In the display device in accordance with some embodiments, the eccentric defect may be mitigated, so that the number of valid light emitting elements LD to which a driving voltage of the display device can be applied may increase, and so that the emission rate of the display device may increase.

The first contact electrode CNE1 may be located to at least partially overlap with the first end EP1 of each of the light emitting elements LD. The first contact electrode CNE1 may be located to at least partially overlap with the first electrode EL1. Hence, the first contact electrode CNE1 may electrically and/or physically couple the first end EP1 of the light emitting element LD with the first electrode EL1.

The second contact electrode CNE2 may be located to at least partially overlap with the second end EP2 of each of the light emitting elements LD. The second contact electrode CNE2 may be located to at least partially overlap with the second electrode EL2. Hence, the second contact electrode CNE2 may electrically and/or physically couple the second end EP2 of the light emitting element LD with the second electrode EL2.

In a plan view, the first contact electrode CNE1 and the second contact electrode CNE2 each may have a bar shape extending in the second direction DR2, but the present disclosure is not limited thereto. In some embodiments, the shape of each of the first contact electrode CNE1 and the second contact electrode CNE2 may be changed in various ways within a range in which the first and second contact electrodes CNE1 and CNE2 can be reliably electrically coupled with each of the light emitting elements LD. The shape of each of the first contact electrode CNE1 and the second contact electrode CNE2 may be changed in various ways in consideration of a respective connection relationship with the first electrode EL1 and the second electrode EL2 that are respectively located thereunder.

Each of the light emitting elements LD may be located between the first electrode EL1 and the second electrode EL2 such that the longitudinal direction (L) thereof is substantially parallel to the first direction DR1.

The first end EP1 of the light emitting element LD may overlap with the first electrode EL1 and the first contact electrode CNE1. The first end EP1 of the light emitting element LD may be physically and/or electrically coupled with the first electrode EL1 and the first contact electrode CNE1. In some embodiments, the first end EP1 of the light emitting element LD may come into contact with the first contact electrode CNE1 rather than overlapping with the first electrode EL1, and thus may receive a voltage of the first driving power supply VDD from the first electrode EL1 through the first contact electrode CNE1.

The second end EP2 of the light emitting element LD may overlap with the second electrode EL2 and the second contact electrode CNE2. The second end EP2 of the light emitting element LD may be physically and/or electrically coupled with the second electrode EL2 and the second contact electrode CNE2. In some embodiments, the second end EP2 of the light emitting element LD may come into contact with the second contact electrode CNE2 rather than overlapping with the second electrode EL2, and thus may receive a voltage of the second driving power supply VSS from the second electrode EL2 through the second contact electrode CNE2.

Referring to FIGS. 6 and 7, the display device in accordance with some embodiments may include a base layer BSL, and may also include a pixel circuit layer PCL and a display element layer DPL that are located on one surface of the base layer BSL.

Although omitted in FIG. 7, components of the pixel circuit layer PCL may be identical with that of the pixel circuit layer PCL shown in FIG. 6. The present disclosure is not limited thereto, and the pixel circuit layer PCL of FIGS. 6 and 7 may further include a second transistor T2, a third transistor T3, and a storage capacitor Cst.

The base layer BSL may be a rigid substrate or a flexible substrate, and a may be a substrate including transparent insulating material to allow light to transmit therethrough.

The pixel circuit layer PCL may include a buffer layer BFL, a first transistor T1, a plurality of insulating layers GI and ILD, a driving voltage line DVL, and a passivation layer PSV.

The buffer layer BFL may reduce or prevent impurities from diffusing into the pixel circuit layer PCL. The buffer layer BFL may be an inorganic insulating layer formed of inorganic material. For example, the buffer layer BFL may include at least one of silicon nitride SiNx, silicon oxide SiOx, silicon oxynitride SiOxNy, and/or aluminum oxide AlOx. The buffer layer BFL may be omitted depending on the material of the base layer BSL, processing conditions, etc.

The first transistor T1 may include a semiconductor layer ACT1, a gate electrode G1, a drain electrode D1, and a source electrode S1. In some embodiments, the drain electrode D1 and the source electrode S1 may be switched with each other.

The semiconductor layer ACT1 may be located on the buffer layer BFL. The semiconductor layer ACT1 may include a drain area coupled to the drain electrode D1, a source area coupled to the source electrode S1, and a channel area between the drain area and the source area. The channel area may overlap with the gate electrode G1 of the first transistor T1. The semiconductor layer ACT1 may be a semiconductor pattern formed of poly silicon, amorphous silicon, an oxide semiconductor, etc.

The gate insulating layer GI may be located on the semiconductor layer ACT1 to cover the semiconductor layer ACT1 and the buffer layer BFL. The gate insulating layer GI may be an inorganic insulating layer including inorganic material. For example, the gate insulating layer GI may include at least one of metal oxides such as silicon nitride (SiNx), silicon oxide (SiOx), silicon oxynitride (SiOxNy), and/or aluminum oxide (AlOx). In some embodiments, the gate insulating layer GI may be formed of an organic insulating layer including organic material. The gate insulating layer GI may be provided in a single-layer structure, or may also be provided in a multilayer structure having two or more layers.

The gate electrode G1 may be located on the gate insulating layer GI to overlap with the channel area of the semiconductor layer ACT1. The gate electrode G1 may have a single-layer structure formed of one of, or a combination of, those selected from the group consisting of copper (Cu), molybdenum (Mo), tungsten (W), aluminum neodymium (AlNd), titanium (Ti), aluminum (Al), silver (Ag), and/or an alloy thereof. Furthermore, the gate electrode G1 may have a double-layer or multi-layer structure formed of molybdenum (Mo), titanium (Ti), copper (Cu), aluminum (Al), or silver (Ag), which are low-resistance materials.

The interlayer insulating layer ILD may be located on the gate electrode G1 to cover the gate electrode G1 and the gate insulating layer GI. The interlayer insulating layer ILD may include the same material as that of the gate insulating layer GI, or may include one or more materials selected from among materials exemplified as the material for forming the gate insulating layer GI.

The interlayer insulating layer ILD may include a contact hole to be used to couple the drain electrode D1 of the first transistor T1 and the source electrode S1 of the first transistor T1 to the drain area and the source area of the semiconductor layer ACT1, respectively.

The drain electrode D1 of the first transistor T1, the source electrode S1 of the first transistor T1, and the driving voltage line DVL may be located on the interlayer insulating layer ILD.

The drain electrode D1 and the source electrode S1 may be respectively coupled to the source area and the drain area of the semiconductor layer ACT1 through contact holes that successively pass through the gate insulating layer GI and the interlayer insulating layer ILD. The drain electrode D1 may have the same configuration as that of the first terminal of the first transistor T1 described with reference to FIGS. 3 and 4. The source electrode S1 may have the same configuration as that of the second terminal of the first transistor T1 described with reference to FIGS. 3 and 4.

The driving voltage line DVL may have the same configuration as that of the second power line PL2 described with reference to FIGS. 3 and 4. Hence, the voltage of the second power supply VSS may be applied to the driving voltage line DVL. In other embodiments, the pixel circuit layer PCL may further include a first power line coupled to the first driving power supply.

Although the driving voltage line DVL has been described as being located on the same layer as that of the drain electrode D1 and the source electrode S1 of the first transistor T1, the present disclosure is not limited thereto. In some embodiments, the driving voltage line DVL may be located on the same layer as that of any one conductive layer of the conductive layers provided on the pixel circuit layer PCL.

The passivation layer PSV may be located on the drain electrode D1, the source electrode S1, and the driving voltage line DVL to cover the drain electrode D1 and the source electrode S1 of the first transistor T1, the driving voltage line DVL, and the interlayer insulating layer ILD.

The passivation layer PSV may include an inorganic insulating layer and/or an organic insulating layer. The inorganic insulating layer may include at least one of metal oxides such as silicon oxide (SiOx), silicon nitride (SiNx), silicon oxynitride (SiOxNy), and/or aluminum oxide (AlOx). The organic insulating layer may include at least one of polyacrylates resin, epoxy resin, phenolic resin, polyamides resin, polyimides rein, unsaturated polyesters resin, poly-phenylen ethers resin, poly-phenylene sulfides resin, and/or benzocyclobutene resin.

The passivation layer PSV may include a first contact hole CH1 that exposes the source electrode S1 of the first transistor T1, and a second contact hole CH2 that exposes the driving voltage line DVL. The source electrode S1 of the first transistor T1 may be physically and/or electrically coupled with the first electrode EL1 through the first contact hole CH1. The driving voltage line DVL may be physically and/or electrically coupled with the second electrode EL2 through the second contact hole CH2.

The display element layer DPL may be located on the passivation layer PSV. The display element layer DPL may include a bank pattern BNKP, a bank BNK, a light emitting element LD, a first contact electrode CNE1, a second contact electrode CNE2, and a plurality of insulating layers INS1, INS2, and INS3.

The bank pattern BNKP may be located on the passivation layer PSV. The bank pattern BNKP may have a trapezoidal cross-section which is reduced in width from one surface (e.g., an upper surface) of the passivation layer PSV upward in the third direction DR3. In some embodiments, the bank pattern BNKP may include a curved surface having a cross-sectional shape such as a semi-elliptical shape or a semi-circular shape (or a hemispherical shape) that is reduced in width from one surface of the passivation layer PSV upward in the third direction DR3. In a sectional view, the shape of the bank pattern BNKP is not limited to the foregoing examples, and may be changed in various ways within a range in which the efficiency of light emitted from each of the light emitting elements LD can be enhanced.

The bank pattern BNKP may be an inorganic insulating layer including inorganic material or an organic insulating layer including organic material. In some embodiments, the bank pattern BNKP may include an organic insulating layer having a single-layer structure and/or an inorganic insulating layer having a single-layer structure, but the present disclosure is not limited thereto. In some embodiments, the bank pattern BNKP may be omitted.

The first electrode EL1 and the second electrode EL2 may be located on the passivation layer PSV and the bank pattern BNKP. The first electrode EL1 and the second electrode EL2 each may be located on the bank pattern BNKP. The first electrode EL1 may be located on the first bank pattern BNKP1, and the second electrode EL2 may be located on the second bank pattern BNKP2. In a sectional view, the first electrode EL1 and the second electrode EL2 each may have a surface profile corresponding to the shape of the bank pattern BNKP. In some embodiments, in the case where the bank pattern BNKP is omitted, the first electrode EL1 and the second electrode EL2 may be located on the upper surface of the passivation layer PSV.

A portion of the first electrode EL1 that extends in the first direction DR1 may be located on the first bank pattern BNKP1, and one or more other portions of the first electrode EL1 may be located on the passivation layer PSV. Opposite ends of the first electrode EL1 may be provided on the passivation layer PSV.

Furthermore, a portion of the second electrode EL2 that extends in the first direction DR1 may be located on the second bank pattern BNKP2, and one or more other portions of the second electrode EL2 may be located on the passivation layer PSV. Opposite ends of the second electrode EL2 may be provided on the passivation layer PSV.

In some embodiments, a distance dd1 between an end 13 of the first electrode EL1 and an end 11 of the first bank pattern BNKP1 may be greater than a distance dd2 between an end 14 of the second electrode EL2 and an end 12 of the second bank pattern BNKP2. For example, a distance dd11 between an end 130 of the first electrode EL1 and an end 110 of the first bank pattern BNKP1 may be about 3 μm or more. A distance dd21 between an end 140 of the second electrode EL2 and an end 120 of the second bank pattern BNKP2 may be less than about 3 μm.

In some embodiments, the distance dd1 between the end 11 of the first bank pattern BNKP1 and the end 13 of the first electrode EL1, and the distance dd2 between the end 12 of the second bank pattern BNKP2 and the end 14 of the second electrode EL2, may be formed to be different from each other, so that when the light emitting elements LD are aligned, the intensity of electric force formed on the end 13 of the first electrode EL1 may be different from that of the end 14 of the second electrode EL2. For example, the size of an electric field formed on a side at which the distance dd1 or dd2 between the end 11 or 12 of the first or second bank pattern BNKP1 or BNKP2 and the end 13 or 14 of the first or second electrode EL1 or EL2 is small may be greater than that of the other side. If the intensity of electric force formed on the end 13 of the first electrode EL1 differs from the intensity of electric force formed on the end 14 of the second electrode EL2, the light emitting elements LD may be eccentric in a direction (e.g., a predetermined direction). For example, the light emitting elements may be aligned at positions displaced from the center. Hence, the light emitting elements LD may be aligned in the corresponding direction between the first electrode EL1 and the second electrode EL2.

In the display device in accordance with some embodiments, the eccentric defect may be mitigated, so that in the display device the number of valid light emitting elements LD to which a driving voltage can be applied may be increased, and the emission rate of the light emitting elements LD may be increased.

The distance dd11 between one end 130 (or a first end) of the first electrode EL1 and one end 110 (or a first end) of the first bank pattern BNKP1 may be substantially identical to, or different from, a distance dd12 between the other end 131 (or a second end) of the first electrode EL1 and the other end 111 (or a second end) of the first bank pattern BNKP1.

In some embodiments, the distance dd11 between the first end 130 of the first electrode EL1 and the first end 110 of the first bank pattern BNKP1 may be substantially identical to the distance dd12 between the second end 131 of the first electrode EL1 and the second end 111 of the first bank pattern BNKP1.

The distance dd21 between one end 140 (or a first end) of the second electrode EL2 and one end 120 (or a first end) of the second bank pattern BNKP2 may be substantially identical to, or different from, a distance dd22 between the other end 141 (or a second end) of the second electrode EL2 and the other end 121 (or a second end) of the second bank pattern BNKP2.

In some embodiments, the distance dd21 between the first end 140 of the second electrode EL2 and the first end 120 of the second bank pattern BNKP2 may be substantially identical to the distance dd22 between the second end 141 of the second electrode EL2 and the second end 121 of the second bank pattern BNKP2.

Even if the first end 130 and the second end 131 of the first electrode EL1 are located to be symmetrical or asymmetrical with each other based on the first bank pattern BNKP1, the end 13 of the first electrode EL1 and the end 14 of the second electrode EL2 may be formed to be different in length based on the light emitting element LD, in some embodiments. Hence, when the light emitting element LD is aligned, occurrence of an eccentric defect may be mitigated. Some embodiments in which the ends 130 and 131 of the first electrode EL1 and the ends 140 and 141 of the second electrode EL2 are formed to be asymmetrical with each other will be described below with reference to FIG. 9.

The first electrode EL1 and the second electrode EL2 each may be formed of material having a reflectivity (e.g., a predetermined reflectivity) to enable light emitted from the light emitting element LD to travel in an image display direction (e.g., in the third direction DR3) of the display device. For example, the first electrode EL1 and the second electrode EL2 each may be formed of a single layer including conductive oxide such as indium tin oxide (ITO), indium zinc oxide (IZO), zinc oxide (ZnO), indium gallium zinc oxide (IGZO), or indium tin zinc oxide (ITZO), and/or a conductive polymer such as PEDOT (poly(3,4-ethylenedioxythiophene)). Furthermore, the first electrode EL1 and the second electrode EL2 each may be formed of a multi-layer that further includes at least one metal of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof.

The first electrode EL1 may be physically and/or electrically coupled with the source electrode S1 of the first transistor T1 through the first contact hole CH1. The second electrode EL2 may be physically and/or electrically coupled with the driving voltage line DVL through the second contact hole CH2.

The first insulating layer INS1 may be located on the passivation layer PSV to at least partially cover the first electrode EL1, the second electrode EL2, and the passivation layer PSV. The first insulating layer INS1 may be located between the first electrode EL1 and the second electrode EL2 so that the likelihood of short-circuiting between the first electrode EL1 and the second electrode EL2 may be reduced or prevented.

The first insulating layer INS1 may be formed of an inorganic insulating layer including inorganic material, or an organic insulating layer including organic material. For example, the first insulating layer INS1 may include at least one of metal oxides such as silicon nitride SiNx, silicon oxide SiOx, silicon oxynitride SiOxNy, and/or aluminum oxide AlOx, but the present disclosure is not limited thereto. The first insulating layer INS1 may be formed of an inorganic insulating layer or an organic insulating layer having an ability to protect the light emitting elements LD from the pixel circuit layer PCL.

The light emitting element LD may be located on the first insulating layer INS1. The first end EP1 of the light emitting element LD may be located to face the first electrode EL1. The second end EP2 of the light emitting element LD may be located to face the second electrode EL2. Therefore, the light emitting element LD may be supplied with a voltage of the first driving power supply VDD through the first end EP1, and may be supplied with a voltage of the second driving power supply VSS through the second end EP2.

Furthermore, when light emitting elements LD are aligned, the light emitting elements LD may be eccentric in a direction (e.g., a predetermined direction) due to an electric field caused by an alignment voltage applied between the first electrode EL1 and the second electrode EL2. For example, the light emitting elements may be aligned at positions displaced from the center. Detailed descriptions of alignment of the light emitting elements LD will be made with reference to FIGS. 10 to 12.

The bank BNK may be located on the first insulating layer INS1. At the step of supplying the light emitting elements LD to the emission area EMA, the bank BNK may be a dam structure configured to reduce or prevent a solution including the light emitting elements LD from being drawn into the emission area EMA of an adjacent pixel PXL, or configured to control the amount of solution such that a relatively constant amount of solution is supplied to each emission area EMA.

The bank BNK may include light shielding material and/or reflective material, thus reducing or preventing a light leakage defect in which light (or rays) leaks between adjacent pixels PXL. In some embodiments, the bank BNK may include transparent material. For example, the bank BNK may include polyamides resin, polyimides resin, etc., but the present disclosure is not limited thereto. In some embodiments, to enhance the efficiency of light emitted from the pixel PXL, a separate reflective material layer may be provided and/or formed on the bank BNK.

Although in the present embodiments, the bank BNK has been described as being located on the first insulating layer INS1, the present disclosure is not limited thereto. In some embodiments, the bank BNK may be located on the upper surface of the passivation layer PSV, and may be located to at least partially overlap with the first electrode EL1 and the second electrode EL2.

The second insulating layer INS2 may be located on each of the light emitting elements LD. The second insulating layer INS2 may be located on a portion of the upper surface of the light emitting element LD such that the first end EP1 and the second end EP2 of the light emitting element LD are exposed to the outside. After the arrangement of the light emitting elements LD in the pixel area PXA have been completed, the second insulating layer INS2 is located on the light emitting elements LD so that a likelihood of the light emitting elements LD being removed from the aligned positions may be reduced or prevented.

The second insulating layer INS2 may be formed of an organic insulating layer including organic material, depending on design conditions, etc. of the display device including the light emitting elements LD.

In the case where a gap (or space) is present between the first insulating layer INS1 and the light emitting element LD before the formation of the second insulating layer INS2, the gap may be filled with the second insulating layer INS2 during a process of forming the second insulating layer INS2. In this case, the second insulating layer INS2 may be formed of an organic insulating layer that is able to fill the gap between the first insulating layer INS1 and the light emitting elements LD.

The second insulating layer INS2 may be formed of a single layer or a multi-layer, and may include an inorganic insulating layer including at least one inorganic material or an organic insulating layer including at least one organic material. For example, the second insulating layer INS2 may include at least one of metal oxides such as silicon nitride SiNx, silicon oxide SiOx, silicon oxynitride SiOxNy, and aluminum oxide AlOx, but the present disclosure is not limited thereto.

The first contact electrode CNE1 may be located to at least partially overlap the first electrode EL1, the first insulating layer INS1, the light emitting element LD, and the second insulating layer INS2. The first contact electrode CNE1 may come into direct contact with the first end EP1 of the light emitting element LD and the first electrode EL1, and may physically and/or electrically reliably couple the first end EP1 of the light emitting element LD to the first electrode EL1. The first contact electrode CNE1 may include transparent conductive material, such as indium tin oxide (ITO), indium zinc oxide (IZO), zinc oxide (ZnO), and indium gallium zinc oxide (IGZO).

The second contact electrode CNE2 may be located to at least partially overlap the second electrode EL2, the first insulating layer INS1, the light emitting element LD, and the second insulating layer INS2. The second contact electrode CNE2 may come into direct contact with the second end EP2 of the light emitting element LD and the second electrode EL2, and may physically and/or electrically reliably couple the second end EP2 of the light emitting element LD to the second electrode EL2. The second contact electrode CNE2 may include transparent conductive material such as indium tin oxide (ITO), indium zinc oxide (IZO), zinc oxide (ZnO), and indium gallium zinc oxide (IGZO).

The third insulating layer INS3 may be located on the second insulating layer INS2, the first contact electrode CNE1, the second contact electrode CNE2, and the bank BNK to at least partially cover the second insulating layer INS2, the first contact electrode CNE1, the second contact electrode CNE2, and the bank BNK. The third insulating layer INS3 may be an inorganic insulating layer including inorganic material, or an organic insulating layer including organic material. For example, the third insulating layer INS3 may include at least one of metal oxides such as silicon nitride SiNx, silicon oxide SiOx, silicon oxynitride SiOxNy, and/or aluminum oxide AlOx, but the present disclosure is not limited thereto.

Furthermore, the third insulating layer INS3 may have a structure formed by alternately stacking at least one inorganic insulating layer and at least one organic insulating layer. The third insulating layer INS3 may cover the entirety of the display element layer DPL, and may reduce or prevent water or moisture from being drawn into the display element layer DPL including the light emitting elements LD from the outside.

Although it has been described that the first contact electrode CNE1 and the second contact electrode CNE2 are located on an identical layer through an identical process, the present disclosure is not limited thereto. In some embodiments, the first contact electrode CNE1 and the second contact electrode CNE2 may be located on different layers with the third insulating layer INS3 interposed therebetween.

In some embodiments, the display element layer DPL may selectively further include an optical layer as well as including the third insulating layer INS3. For example, the display element layer DPL may further include a color conversion layer including color conversion particles for converting the color of light emitted from the light emitting elements LD to a specific color of light.

In some embodiments, at least one overcoat layer (e.g., a layer for planarizing an upper surface of the display element layer DPL) may be further located over the third insulating layer INS3.

Hereinafter, relationship between an end of each electrode and an end of each bank pattern will be described with reference to FIGS. 8 and 9.

Figure 8:
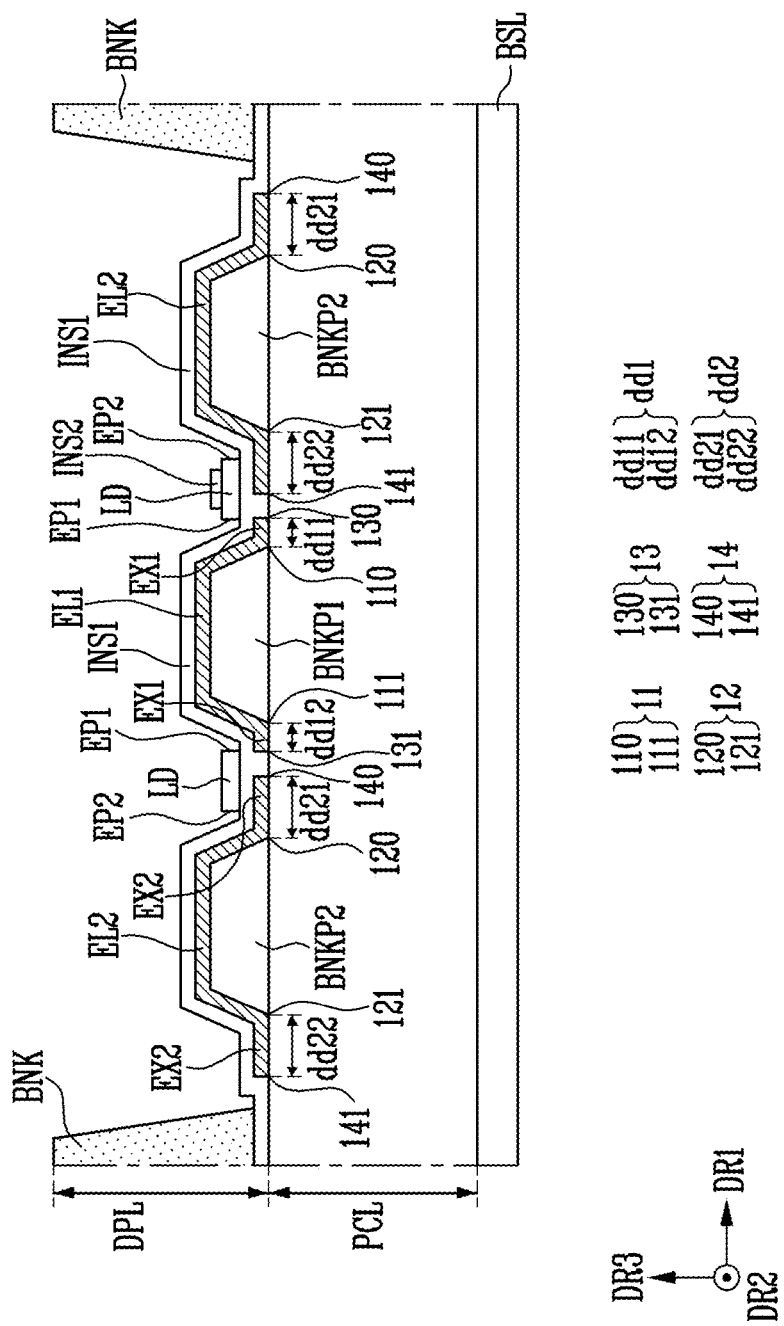
FIGS. 8 and 9 are sectional views schematically illustrating an area of the display device in accordance with some embodiments.
Figure 9:
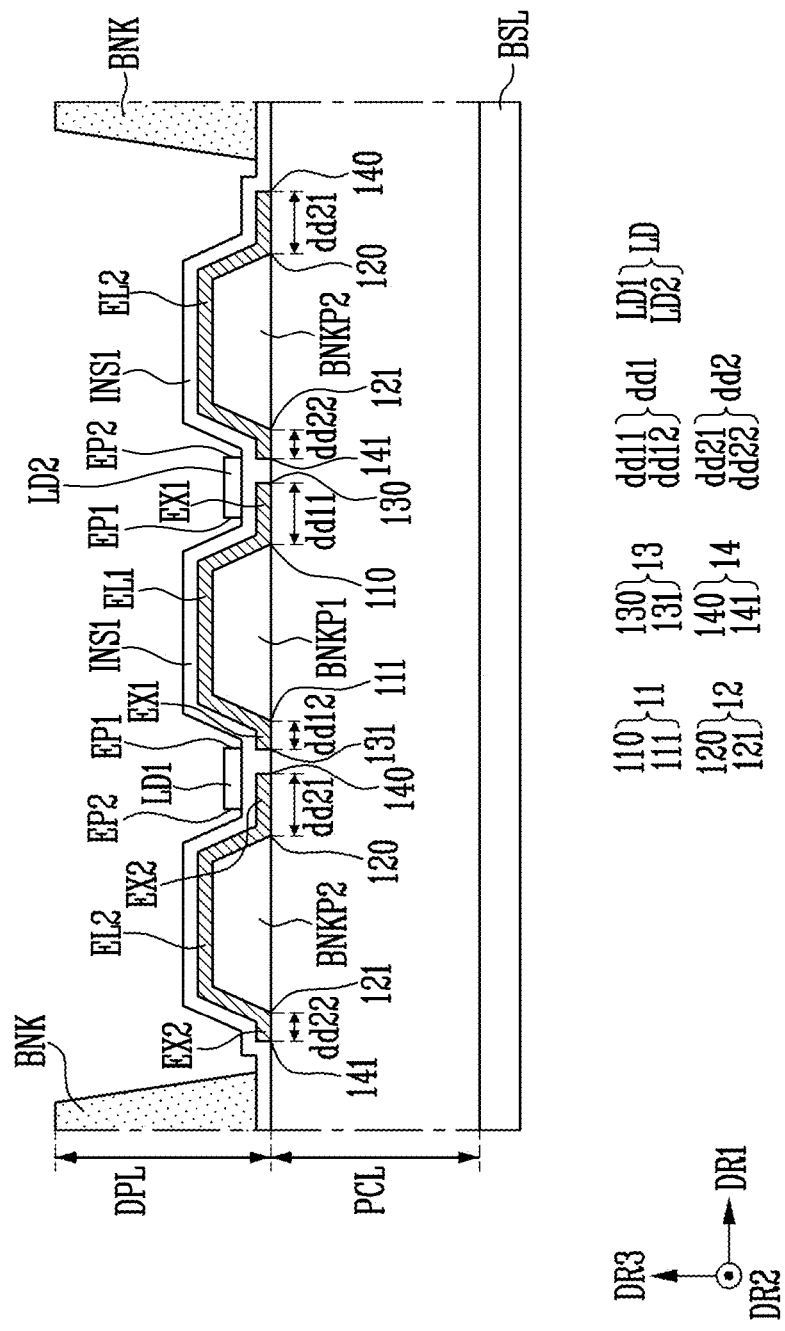

FIGS. 8 and 9 are sectional views schematically illustrating an area (e.g., a predetermined area) of the display device in accordance with some embodiments.

Referring to FIGS. 8 and 9, the display device in accordance with some embodiments may include a pixel circuit layer PCL and a display element layer DPL, which are located on the base layer BSL. The pixel circuit layer PCL shown in FIGS. 8 and 9 may correspond to the above-described pixel circuit layer PCL of FIGS. 6 and 7. The display element layer DPL shown in FIGS. 8 and 9 may correspond to the above-described display element layer DPL of FIGS. 6 and 7.

Although the first contact electrode CNE1, the second contact electrode CNE2, the second insulating layer INS2, and the third insulating layer INS3 are omitted in FIGS. 8 and 9 so as to describe relationship between the first electrode EL1, the second electrode EL2, the first bank pattern BNKP1, and the second bank pattern BNKP2, it should be noted that the first contact electrode CNE1, the second contact electrode CNE2, the second insulating layer INS2, and the third insulating layer INS3 may correspond to the corresponding components described with reference to FIGS. 6 and 7. In FIGS. 8 and 9, the same descriptions as those of FIGS. 6 and 7 will be omitted, and the following descriptions will be focused on differences therefrom.

First, referring to FIG. 8, a portion of the first electrode EL1 that extends in the first direction DR1 may be located on the first bank pattern BNKP1, and one or more other portions (e.g., a remainder) thereof may be located on the passivation layer PSV. Opposite ends of the first electrode EL1 may be provided on the passivation layer PSV. The portion of the first electrode EL1 that does not overlap with the first bank pattern BNKP1 may be referred to as an extension EX1 of the first electrode EL1.

Furthermore, a portion of the second electrode EL2 that extends in the first direction DR1 may be located on the second bank pattern BNKP2, and one or more other portions (e.g., a remainder) thereof may be located on the passivation layer PSV. Opposite ends of the second electrode EL2 may be provided on the passivation layer PSV. The portion of the second electrode EL2 that does not overlap with the second bank pattern BNKP2 may be referred to as an extension EX2 of the second electrode EL2.

In some embodiments, a distance dd1 between an end 13 of the first electrode EL1 and an end 11 of the first bank pattern BNKP1 may be less than a distance dd2 between an end 14 of the second electrode EL2 and an end 12 of the second bank pattern BNKP2. For example, a distance dd11 between an end 130 of the first electrode EL1 and an end 110 of the first bank pattern BNKP1 may be less than about 3 μm. A distance dd21 between an end 140 of the second electrode EL2 and an end 120 of the second bank pattern BNKP2 may be about 3 μm or more.

In some embodiments, the extension EX1 of the first electrode EL1 may differ in length from the extension EX2 of the second electrode EL2. In other words, the length of the extension EX1 of the first electrode EL1 may correspond to a length from the end 11 of the first bank pattern BNKP1 to the end 13 of the first electrode EL1. The length of the extension EX2 of the second electrode EL2 may correspond to a length from the end 12 of the second bank pattern BNKP2 to the end 14 of the second electrode EL2. Thus, the length of the extension EX1 of the first electrode EL1 may differ from that of the extension EX2 of the second electrode EL2.

For example, when the length of the extension EX1 of the first electrode EL1 is greater than the length of the extension EX2 of the second electrode EL2, the length of the extension EX1 of the first electrode EL1 may be about 3 μm or more, and the length of the extension EX2 of the second electrode EL2 may be less than about 3 μm. In some embodiments, when the length of the extension EX1 of the first electrode EL1 is less than the length of the extension EX2 of the second electrode EL2, the length of the extension EX1 of the first electrode EL1 may be less than about 3 μm, and the length of the extension EX2 of the second electrode EL2 may be about 3 μm or more.

In some embodiments, the distance dd1 between the end 11 of the first bank pattern BNKP1 and the end 13 of the first electrode EL1, and the distance dd2 between the end 12 of the second bank pattern BNKP2 and the end 14 of the second electrode EL2, may be formed to be different from each other, so that when the light emitting elements LD are aligned, the intensity of electric force formed on the end 13 of the first electrode EL1 may be different from that of the end 14 of the second electrode EL2. For example, the size of the electric field formed at one side at which the distance dd1 or dd2 between the end 11 or 12 of the first or second bank pattern BNKP1 or BNKP2 and the end 13 or 14 of the first or second electrode EL1 or EL2 is small, may be greater than the electric field of the other side. If the intensity of electric force formed on the end 13 of the first electrode EL1 differs from the intensity of electric force formed on the end 14 of the second electrode EL2, the light emitting elements LD may be eccentric in a direction (e.g., a predetermined direction). For example, the light emitting elements may be aligned at positions displaced from the center. Hence, the light emitting elements LD may be aligned at positions (e.g., predetermined positions) and/or in the corresponding direction between the first electrode EL1 and the second electrode EL2.

In the display device in accordance with some embodiments, the eccentric defect may be mitigated, so that in the display device the number of valid light emitting elements LD to which a driving voltage can be applied may be increased, and so that the emission rate of the light emitting elements LD may be increased.

Furthermore, the distance dd11 between the first end 130 of the first electrode EL1 and the first end 110 of the first bank pattern BNKP1 may be substantially identical to the distance dd12 between the second end 131 of the first electrode EL1 and the second end 111 of the first bank pattern BNKP1.

The distance dd21 between the first end 140 of the second electrode EL2 and the first end 120 of the second bank pattern BNKP2 may be substantially identical to the distance dd22 between the second end 141 of the second electrode EL2 and the second end 121 of the second bank pattern BNKP2. In other words, the first end 130 and the second end 131 of the first electrode EL1 may be located to be symmetrical with each other based on the first bank pattern BNKP1. The first end 140 and the second end 141 of the second electrode EL2 may be located to be symmetrical with each other based on the second bank pattern BNKP2.

On the other hand, referring to FIG. 9, the first end 130 and the second end 131 of the first bank pattern BNKP1 may be located to be asymmetrical with each other. The first end 140 and the second end 141 of the second electrode EL2 may be located to be asymmetrical with each other based on the second bank pattern BNKP2.

In detail, the distance dd11 between the first end 130 of the first electrode EL1 and the first end 110 of the first bank pattern BNKP1 may be different from the distance dd12 between the second end 131 of the first electrode EL1 and the second end 111 of the first bank pattern BNKP1. In some embodiments, the distance dd11 between the first end 130 of the first electrode EL1 and the first end 110 of the first bank pattern BNKP1 may be greater than the distance dd12 between the second end 131 of the first electrode EL1 and the second end 111 of the first bank pattern BNKP1.

The distance dd21 between the first end 140 of the second electrode EL2 and the first end 120 of the second bank pattern BNKP2 may differ from the distance dd22 between the second end 141 of the second electrode EL2 and the second end 121 of the second bank pattern BNKP2. The distance dd21 between the first end 140 of the second electrode EL2 and the first end 120 of the second bank pattern BNKP2 may be greater than the distance dd22 between the second end 141 of the second electrode EL2 and the second end 121 of the second bank pattern BNKP2.

In some embodiments, even if the first end and the second end of each electrode are located to be asymmetrical with each other based on each bank pattern, the aspect of mitigating an eccentricity defect of the light emitting element LD may be implemented.

A first light emitting element LD1 may be located between the second end 131 of the first electrode EL1 and the first end 140 of the second electrode EL2. Here, the distance dd12 between the second end 131 of the first electrode EL1 and the second end 111 of the first bank pattern BNKP1 may be less than the distance dd21 between the first end 140 of the second electrode EL2 and the first end 120 of the second bank pattern BNKP2. In other words, the distance dd1 between the end 11 of the first bank pattern BNKP1 on which the first light emitting element LD1 is located and the end 13 of the first electrode EL1, and the distance dd2 between the end 12 of the second bank pattern BNKP2 and the end 14 of the second electrode EL2, may be formed to be different from each other, so that when the light emitting elements LD are aligned, the intensity of electric force formed on the end 13 of the first electrode EL1 may be different from that of the end 14 of the second electrode EL2. For example, the size of an electric field formed at a side at which the distance between the end of the bank pattern BNKP and the end of the first or second electrode EL1 or EL2 is small may be greater than the size of an electric field formed at the other side. If the intensity of electric force formed on the end 13 of the first electrode EL1 differs from the intensity of electric force formed on the end 14 of the second electrode EL2, the light emitting elements LD may be eccentric in a direction (e.g., a predetermined direction). Hence, the light emitting elements LD may be aligned at positions (e.g., predetermined positions) and/or in the corresponding direction between the first electrode EL1 and the second electrode EL2.

In the display device in accordance with some embodiments, the eccentric defect may be mitigated, so that the number of valid light emitting elements LD to which a driving voltage of the display device can be applied may be increased, and the emission rate of the display device may be increased.

The second light emitting element LD2 may be located between the first end 130 of the first electrode EL1 and the second end 141 of the second electrode EL2. Here, the distance dd11 between the first end 130 of the first electrode EL1 and the first end 110 of the first bank pattern BNKP1 may be greater than the distance dd22 between the second end 141 of the second electrode EL2 and the second end 121 of the second bank pattern BNKP2. Therefore, in some embodiments, because the intensity of electric force formed on the end 13 of the first electrode EL1 differs from the intensity of electric force formed on the end 14 of the second electrode EL2, the light emitting elements LD may be eccentric in a direction (e.g., a predetermined direction). Hence, the light emitting elements LD may be aligned at positions (e.g., predetermined positions) and/or in the corresponding direction between the first electrode EL1 and the second electrode EL2.

Hereinafter, description of alignment of the light emitting elements LD will be made with reference to FIGS. 10 to 12.

Figure 10:
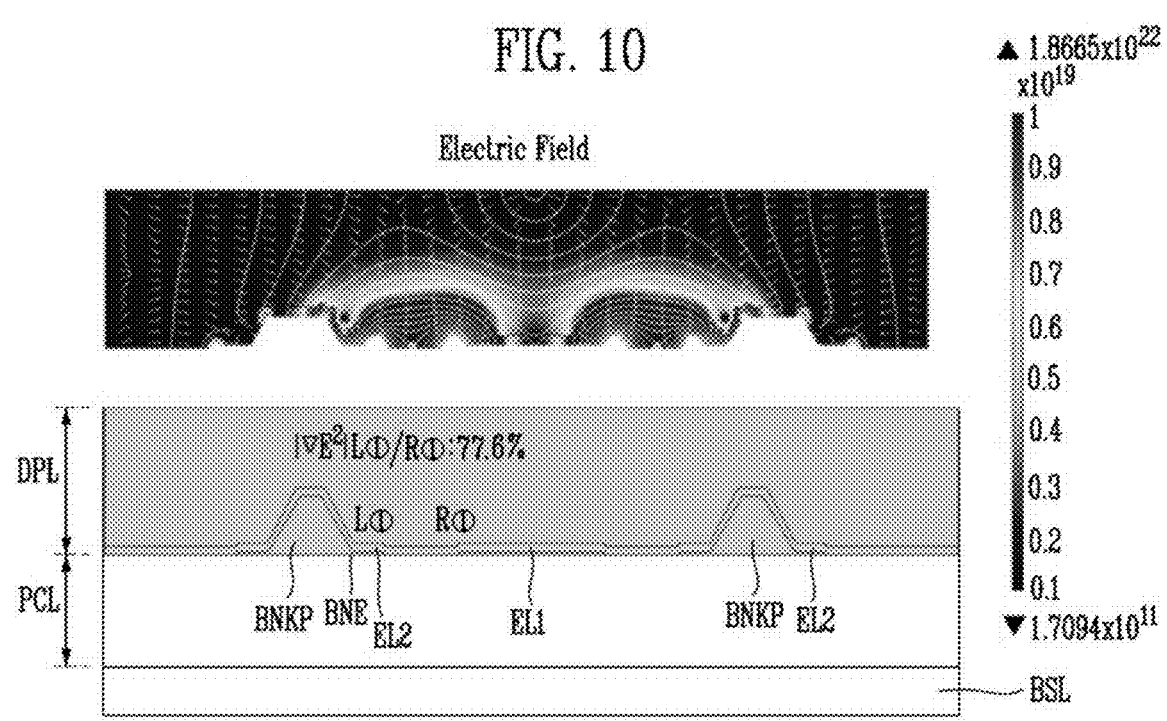
FIG. 10 illustrates images for describing an electric field of the display device in accordance with a comparative example.
Figure 11:
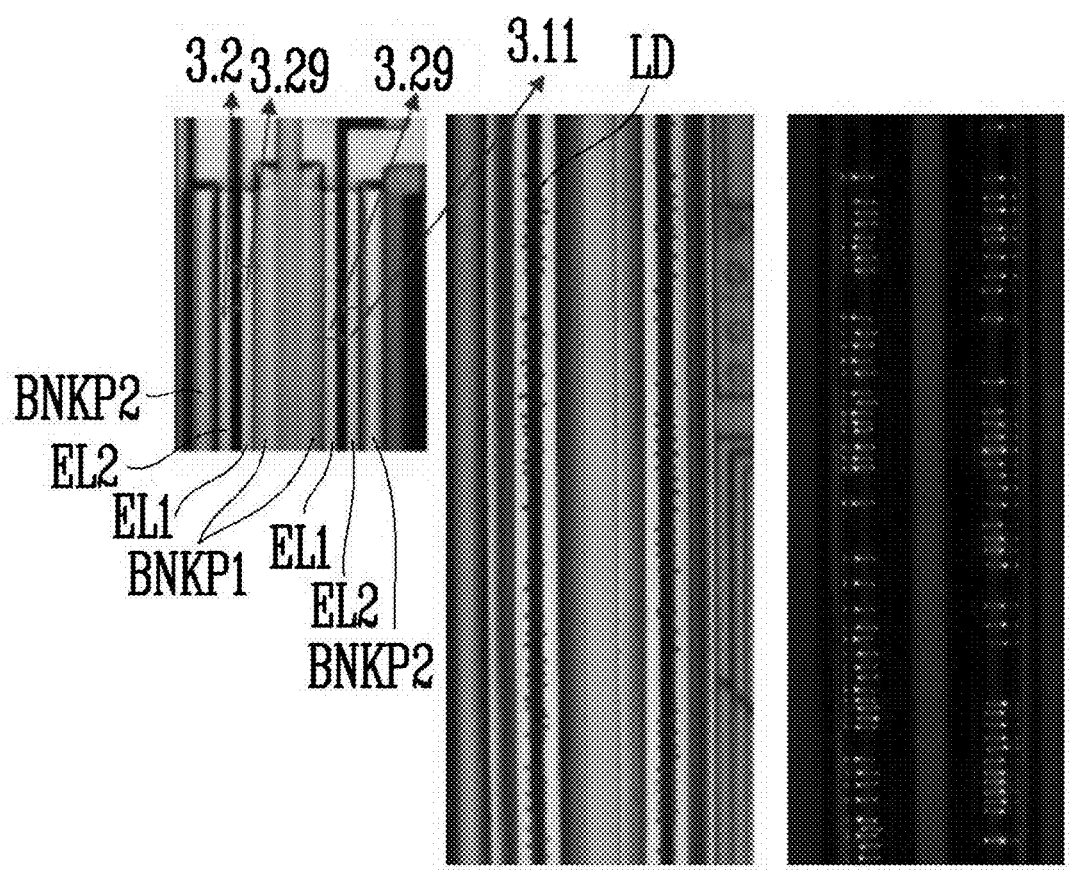
FIG. 11 illustrates images for describing an eccentricity defect of a light emitting element in the display device in accordance with a comparative example.
Figure 12:
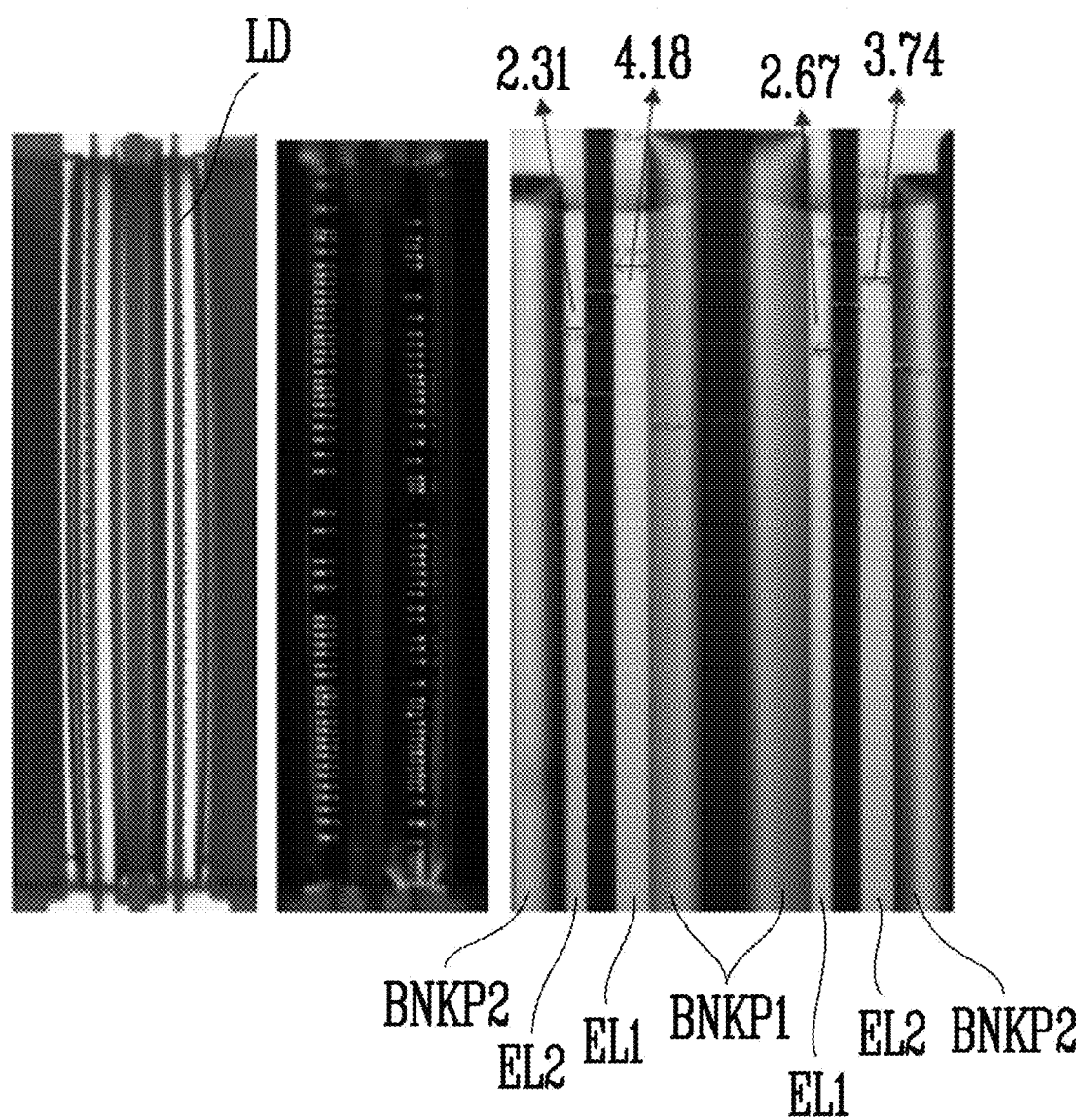
FIG. 12 illustrates images for describing an alignment improvement degree of light emitting elements in the display device in accordance with some embodiments.

FIG. 10 illustrates images for describing an electric field of the display device in accordance with a comparative example, FIG. 11 illustrates images for describing an eccentricity defect of a light emitting element in the display device in accordance with a comparative example, and FIG. 12 illustrates images for describing an alignment improvement degree of light emitting elements in the display device in accordance with some embodiments.

Referring to FIG. 10, the display device in accordance with a comparative embodiments may include a pixel circuit layer PCL and a display element layer DPL, which are located on the base layer BSL. The pixel circuit layer PCL shown in FIG. 10 may correspond to the above-described pixel circuit layer PCL of FIG. 6. The display element layer DPL shown in FIG. 10 may correspond to the above-described display element layer DPL of FIG. 6. FIG. 10 illustrates a bank pattern BNKP, a first electrode EL1, and a second electrode EL2 so as to describe an electric field effect of an alignment electrode. The first electrode EL1 may be located directly on the passivation layer PSV (refer to FIG.

5), and the bank pattern BNKP that is located under the first electrode EL1 is omitted in the preset example.

The first electrode EL1 and the second electrode EL2 may be used as alignment electrodes in such a way that alignment voltages are applied thereto after a mixed solution (e.g., ink) including light emitting elements is input to the emission area. Hence, an electric field may be formed based on the first electrode EL1 and the second electrode EL2. In the case of the second electrode EL2 located on the bank pattern BNKP, electric force may be dispersed by an end BNE of the bank pattern BNKP, so that an electric field may be unevenly formed. Because the electric field by the second electrode EL2 and an electric field by the first electrode EL1 are asymmetrically formed, light emitting elements may be aligned to be biased to the first electrode EL1 or the second electrode EL2 rather than being aligned on the center between the first electrode EL1 and the second electrode EL2. This phenomenon means that an eccentricity defect has occurred.

Referring to FIG. 11, the display device in accordance with a comparative example may include a first electrode EL1, a second electrode EL2, a first bank pattern BNKP1, a second bank pattern BNKP2, and light emitting elements LD.

The light emitting elements LD may be located between the first electrode EL1 and the second electrode EL2. The first electrode EL1 may at least partially overlap with the first bank pattern BNKP1. The second electrode EL2 may at least partially overlap with the second bank pattern BNKP2.

In the comparative example, a distance between an end of the first electrode EL1 and an end of the first bank pattern BNKP1 may be substantially identical to or approximately similar to a distance between an end of the second electrode EL2 and an end of the second bank pattern BNKP2. For instance, the distance between the respective ends of the first electrode EL1 and ends of the first bank pattern BNKP1 may be approximately 3.29 µm. The distance between respective ends of the second electrode EL2 and ends of the second bank pattern BNKP2 may be approximately 3.2 µm or approximately 3.11 µm. In other words, the distance between the end of each electrode and the end of the corresponding bank pattern may range from approximately 3.1 µm to approximately 3.3 µm.

The light emitting elements LD may be aligned between the first electrode EL1 and the second electrode EL2 by applying an alignment voltage to each of the first electrode EL1 and the second electrode EL2. However, in the comparative example, the distance between the end of each electrode and the end of the corresponding bank pattern is approximately constant. Hence, alignment directions and/or positions of the light emitting elements LD may be randomly formed, so that the light emitting elements LD may be biased to the first electrode EL1 or biased to the second electrode EL2. In other words, an eccentricity defect may be caused in which the light emitting elements LD are displaced from the center rather than being aligned at the center to overlap with both of the first electrode EL1 and the second electrode EL2. If the eccentricity defect occurs, the number of valid light emitting elements LD to which the driving voltage of the display device is applied is reduced, so that a contact rate with the pixel electrode may be reduced, and the emission rate of the display device may be reduced.

On the other hand, referring to FIG. 12, in the display device in accordance with some embodiments, the distance between the end of the first electrode EL1 and the end of the first bank pattern BNKP1 may differ from the distance between the end of the second electrode EL2 and the end of the second bank pattern BNKP2. For instance, the distance between respective ends of the first electrode EL1 and ends of the first bank pattern BNKP1 may be approximately 4.18 µm or approximately 2.67 µm. The distance between respective ends of the second electrode EL2 and ends of the second bank pattern BNKP2 may be approximately 2.31 µm or approximately 3.74 µm. In other words, the distance between an end of the first electrode EL1 and a corresponding end of the first bank pattern BNKP1 may be greater than, or may be less than, the distance between an end of the second electrode EL2 and a corresponding end of the second bank pattern BNKP2.

The light emitting elements LD may be aligned between the first electrode EL1 and the second electrode EL2 by applying an alignment voltage to each of the first electrode EL1 and the second electrode EL2.

In accordance with the comparative examples, since the distance between the end of the first bank pattern BNKP1 and the end of the first electrode EL1 is the same as the distance between the end of the second bank pattern BNKP2 and the end of the second electrode EL2, the light emitting elements LD may be randomly arranged during the alignment of the light emitting elements LD. As a result, the light emitting elements LD may be eccentric toward the first bank pattern BNK1 or the second bank pattern BNK2, i.e., an alignment defect may occur. In some embodiments, the distance between the end of the first bank pattern BNKP1 and the end of the first electrode EL1, and the distance between the end of the second bank pattern BNKP2 and the end of the second electrode EL2, may be formed to be different from each other, so that when the light emitting elements LD are aligned, the intensity of electric force formed on the end of the first electrode EL1 may be different from that of the end of the second electrode EL2. For example, the size of an electric field formed at a side at which the distance between the end of the bank pattern BNKP and the end of the first or second electrode EL1 or EL2 is small, may be greater than that formed at the other side. If the intensity of electric force formed on the end of the first electrode EL1 differs from the intensity of electric force formed on the end of the second electrode EL2, the light emitting elements LD may be eccentric in a direction (e.g., a predetermined direction). Hence, the light emitting elements LD may be aligned at positions (e.g., predetermined positions) and/or in the corresponding direction between the first electrode EL1 and the second electrode EL2.

In the display device in accordance with some embodiments, the eccentric defect may be mitigated, so that the number of valid light emitting elements LD to which a driving voltage of the display device can be applied may be increased, and the emission rate of the display device may be increased.

In the display device in accordance with some embodiments, the distance between the end of the first bank pattern BNKP1 and the end of the first electrode EL1, and the distance between the end of the second bank pattern BNKP2 and the end of the second electrode EL2, may be formed to be different from each other, so that when the light emitting elements LD are aligned, a distance (e.g., a contact margin) between the first contact electrode CNE1 and the second contact electrode CNE2 may be increased.

The description of the contact margin will be made below with reference to FIG. 13.

Figure 13:
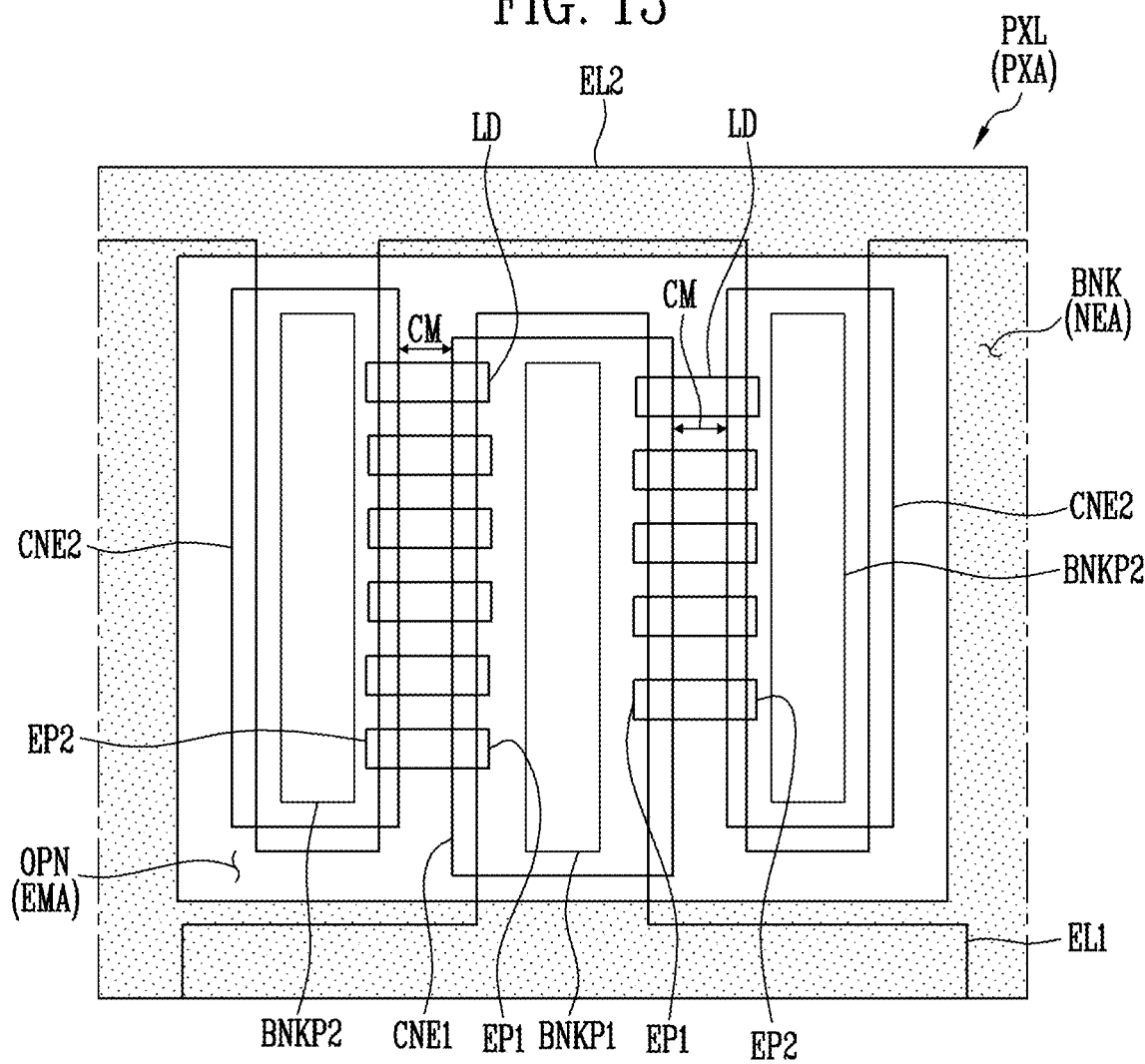
FIG. 13 is a diagram for describing a contact margin of the display device in accordance with some embodiments.

FIG. 13 is a diagram for describing a contact margin of the display device in accordance with some embodiments.

Referring to FIG. 13, the display device in accordance with some embodiments may include a bank BNK, a bank pattern BNKP, a first electrode EL1, a second electrode EL2, a first contact electrode CNE1, a second contact electrode CNE2, and light emitting elements LD.

The components shown in FIG. 13 are the same as the components described with reference with FIG. 5, so that repetitive explanation thereof will be omitted, and the following descriptions will be focused on differences therebetween.

In some embodiments, the distance between the end of the first bank pattern BNKP1 and the end of the first electrode EL1, and the distance between the end of the second bank pattern BNKP2 and the end of the second electrode EL2, are formed to be different from each other, so that when the light emitting elements LD are aligned, eccentricity may be formed in only one direction.

Even if the width between the first contact electrode CNE1 and the second contact electrode CNE2 is not increased to make the light emitting elements LD come into contact with the first contact electrode CNE1 and the second contact electrode CNE2 when the light emitting elements LD are aligned, the alignment of the light emitting elements LD may be facilitated. In other words, because the light emitting elements LD are aligned in a direction (e.g., a predetermined direction) and/or at positions (e.g., predetermined positions), the contact rate at which the light emitting elements LD come into contact with the first contact electrode CNE1 and the second contact electrode CNE2 may be increased even when the distance CM (e.g., the contact margin) between the first contact electrode CNE1 and the second contact electrode CNE2 is increased.

Therefore, in the display device in accordance with some embodiments, the contact margin between the contact electrodes, the contact rate of the light emitting elements and the contact electrodes, and the emission rate can be enhanced.

As described above, in embodiments, a distance between an end of a first bank pattern and an end of a first electrode, and a distance between an end of a second bank pattern and a second electrode, are formed to be different from each other, so that when light emitting elements are aligned, the light emitting elements are aligned in a direction (e.g., a predetermined direction) and/or positions (e.g., predetermined positions) between the first electrode and the second electrode.

In other words, in a display device in accordance with some embodiments, an eccentric defect may be mitigated, so that the number of valid light emitting elements to which a driving voltage of the display device can be applied may be increased, and the emission rate of the display device may be increased.

Furthermore, in the display device in accordance with some embodiments, the distance between the end of the first bank pattern and the end of the first electrode, and the distance between the end of the second bank pattern and the second electrode, are formed to be different from each other, so that when light emitting elements are aligned, a contact margin between the first contact electrode and the second contact electrode may be increased.

The aspects of the present disclosure are not limited by the foregoing, and other various effects are anticipated herein.

While various embodiments have been described above, those skilled in the art will appreciate that various modifications, additions and substitutions are possible, without departing from the scope and spirit of the present disclosure.

Therefore, the embodiments disclosed in this specification are only for illustrative purposes rather than limiting the technical spirit of the present disclosure. The scope of the present disclosure must be defined by the accompanying claims, with the functional equivalents thereof to be included therein.

What is claimed is:

1. A display device comprising:
   a base layer;
   a first bank pattern and a second bank pattern on the base layer, the first bank pattern and the second bank pattern are spaced apart from each other in a first direction;
   a first electrode overlapping the first bank pattern;
   a second electrode overlapping the second bank pattern; and
   a light emitting element aligned between the first electrode and the second electrode,
   wherein a distance in the first direction between an end of the first electrode closest to the light emitting element among ends of the first electrode, and an end of the first bank pattern closest to the light emitting element among ends of the first bank pattern, differs from a distance in the first direction between an end of the second electrode closest to the light emitting element among ends of the second electrode, and an end of the second bank pattern closest to the light emitting element among ends of the second bank pattern.

2. The display device according to claim 1, wherein the distance between the end of the first electrode and the end of the first bank pattern is greater than the distance between the end of the second electrode and the end of the second bank pattern in the first direction.

3. The display device according to claim 1, wherein the distance between the end of the first electrode and the end of the first bank pattern is less than the distance between the end of the second electrode and the end of the second bank pattern in the first direction.

4. The display device according to claim 1, wherein, in a plan view, a width of the first bank pattern is substantially identical to a width of the second bank pattern in the first direction.

5. The display device according to claim 4, wherein, in the plan view, a width of the first electrode differs from a width of the second electrode in the first direction.

6. The display device according to claim 5, wherein the width of the first electrode is greater than the width of the second electrode in the first direction.

7. The display device according to claim 5, wherein the width of the first electrode is less than the width of the second electrode in the first direction.

8. The display device according to claim 1, wherein a distance between a first end of the first electrode and a first end of the first bank pattern is substantially identical to a distance between a second end of the first electrode and a second end of the first bank pattern.

9. The display device according to claim 1, wherein a distance between a first end of the first electrode and a first end of the first bank pattern differs from a distance between a second end of the first electrode and a second end of the first bank pattern.

10. The display device according to claim 1, wherein the light emitting element is aligned between the first electrode and the second electrode such that a longitudinal direction of the light emitting element is substantially parallel with the first direction, and
   wherein a first end of the light emitting element is electrically coupled with the first electrode, and a second end of the light emitting element is electrically coupled with the second electrode.

11. The display device according to claim 1, wherein the distance between the end of the first electrode and the end of the first bank pattern is 3 μm or more in the first direction, and wherein the distance between the end of the second electrode and the end of the second bank pattern is less than 3 μm.

12. A display device comprising:

a base layer;

a bank pattern comprising a first bank pattern and a second bank pattern on the base layer, the first bank pattern and the second bank pattern are spaced apart from each other;

a first electrode on the first bank pattern, at least partially overlapping with the first bank pattern, and comprising an extension that does not overlap with the first bank pattern;

a second electrode on the second bank pattern, at least partially overlapping with the second bank pattern, and comprising an extension that does not overlap with the second bank pattern; and a light emitting element aligned between the first electrode and the second electrode, wherein a length of the extension of the first electrode differs from a length of the extension of the second electrode, and wherein an end of the extension of the first electrode is closest to the light emitting element among ends of the first electrode, and wherein an end of the extension of the second electrode is closest to the light emitting element among ends of the second electrode.

13. The display device according to claim 12, wherein the length of the extension of the first electrode is from an end of the first bank pattern to the end of the extension of the first electrode, and wherein the length of the extension of the second electrode is from an end of the second bank pattern to the end of the extension of the second electrode.

14. The display device according to claim 13, wherein the length of the extension of the first electrode is greater than the length of the extension of the second electrode.

15. The display device according to claim 14, wherein the length of the extension of the first electrode is 3 μm or more, and wherein the length of the extension of the second electrode is less than 3 μm.

16. The display device according to claim 13, wherein the length of the extension of the first electrode is less than the length of the extension of the second electrode.

17. The display device according to claim 16, wherein the length of the extension of the first electrode is less than 3 μm, and wherein the length of the extension of the second electrode is 3 μm or more.

18. The display device according to claim 12, further comprising:

a first contact electrode at least partially overlapping a first end of the light emitting element; and a second contact electrode at least partially overlapping with a second end of the light emitting element.

19. The display device according to claim 18, wherein the first contact electrode is electrically coupled with the first electrode, and is electrically coupled with the first end of the light emitting element.

20. The display device according to claim 18, wherein the second contact electrode is electrically coupled with the second electrode, and is electrically coupled with the second end of the light emitting element.

* * * * *